United States Patent
Tsutsumi

(10) Patent No.: US 10,025,182 B2
(45) Date of Patent: Jul. 17, 2018

(54) RADIATION-SENSITIVE RESIN COMPOSITION AND ELECTRONIC DEVICE

(71) Applicant: ZEON CORPORATION, Tokyo (JP)

(72) Inventor: Takashi Tsutsumi, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 15/124,630

(22) PCT Filed: Mar. 18, 2015

(86) PCT No.: PCT/JP2015/058036
§ 371 (c)(1),
(2) Date: Sep. 8, 2016

(87) PCT Pub. No.: WO2015/141717
PCT Pub. Date: Sep. 24, 2015

(65) Prior Publication Data
US 2017/0023859 A1    Jan. 26, 2017

(30) Foreign Application Priority Data
Mar. 20, 2014    (JP) .............................. 2014-058522

(51) Int. Cl.
*G03F 7/023*    (2006.01)
*C08G 59/20*    (2006.01)
*C08G 59/62*    (2006.01)
*G03F 7/022*    (2006.01)
*G03F 7/038*    (2006.01)
*G03F 7/075*    (2006.01)

(52) U.S. Cl.
CPC ........... *G03F 7/0233* (2013.01); *C08G 59/20* (2013.01); *C08G 59/62* (2013.01); *G03F 7/0226* (2013.01); *G03F 7/038* (2013.01); *G03F 7/0755* (2013.01)

(58) Field of Classification Search
CPC ......................................... G03F 7/008–7/0125
USPC ...................................................... 430/208.1
See application file for complete search history.

(56) References Cited

U.S. PATENT DOCUMENTS

| | | | | |
|---|---|---|---|---|
| 6,200,479 | B1 * | 3/2001 | Zampini | C08G 8/10 210/660 |
| 2004/0219451 | A1 | 11/2004 | Arao et al. | |
| 2006/0199098 | A1 | 9/2006 | Arao et al. | |
| 2006/0199099 | A1 | 9/2006 | Arao et al. | |
| 2008/0292993 | A1 * | 11/2008 | Ishikura | B41J 2/1603 430/320 |
| 2011/0316116 | A1 | 12/2011 | Sato et al. | |
| 2014/0087136 | A1 | 3/2014 | Osaku | |

FOREIGN PATENT DOCUMENTS

| | | |
|---|---|---|
| EP | 2420889 A1 | 2/2012 |
| JP | 2003-215802 A | 7/2003 |
| JP | 2004-240213 A | 8/2004 |
| JP | 2006-100464 A | 4/2006 |
| JP | 2006-243157 A | 9/2006 |
| JP | 2006-243161 A | 9/2006 |
| JP | 2007-57595 A | 3/2007 |
| JP | 2007-78820 A | 3/2007 |
| JP | 2008-164833 A | 7/2008 |
| JP | 2010-100678 A | 5/2010 |
| JP | 2010-224533 A | 10/2010 |
| JP | 2013-130816 A | 7/2013 |
| WO | 2007/026553 A1 | 3/2007 |
| WO | 2012165448 A1 | 12/2012 |

OTHER PUBLICATIONS

English translation of JP, 2013-130816 , A (2013) from machine translation from AIPN Japan Patent Office National Center for Industrial Property Information and Training, generated Jun. 18, 2017, 35 pages.*
English abstract of JP 2013-130816 a from SciFlnder database 3 pages, accesession No. 2013:1047021, CAN 159:187097, CAPLUS generated Jun. 18, 2017.*
Registry compounds attached to JP 2013-130816 a from SciFlnder database 89 pages generated Jun. 18, 2017.*
Azide | Definition of azide in English by Oxford Dictionaries, downloaded from the Web Dec. 2017. 4 pages.*
English translation of International Preliminary Report dated Sep. 20, 2016, issued in International Application No. PCT/JP2015/058036 (7 pages).
International Search Report dated Jun. 2, 2015, issued in counterpart International Application No. PCT/JP2015/058036 (2 pages).
Extended European Search Report dated Sep. 7, 2017, issued in counterpart European Patent Application No. 15764394.1 (in English; 8 pages).

* cited by examiner

*Primary Examiner* — Cynthia Hamilton
(74) *Attorney, Agent, or Firm* — Westerman, Hattori, Daniels & Adrian, LLP

(57) ABSTRACT

A radiation-sensitive resin composition comprising a binder resin (A), a radiation-sensitive compound (B), a tetrafunctional or lower functional epoxy-based cross-linking agent (C) having an epoxy equivalent of 450 or less and a softening point of 30° C. or less, and an aralkyl phenol resin (D) is provided. According to the present invention, it is possible to provide a radiation-sensitive resin composition able to give a resin film high in adhesion to a metal layer and excellent in developability and low hygroscopicity.

8 Claims, No Drawings

RADIATION-SENSITIVE RESIN COMPOSITION AND ELECTRONIC DEVICE

TECHNICAL FIELD

The present invention relates to a radiation-sensitive resin composition and an electronic device provided with a resin film comprised of this radiation-sensitive resin composition, more particularly relates to a radiation-sensitive resin composition able to give a resin film high in adhesion to a metal layer and excellent in developability and low hygroscopicity and an electronic device provided with a resin film comprised of this radiation-sensitive resin composition.

BACKGROUND ART

Various display devices such as organic EL devices and liquid crystal display devices and electronic devices such as integrated circuit devices, solid imaging devices, color filters, and black matrices are provided with various resin films such as surface protective films for preventing deterioration or damage, flattening films for flattening the device surfaces, electrical insulating films for maintaining electrical insulation, and insulating films used in redistribution layers (RDL) formed on surface protective films.

In the past, as the resin materials for forming these resin films, thermosetting resin material such as epoxy resin and polyimide has been generally used. In recent years, along with the increasing density of interconnects and devices, for these resin materials as well, development of new resin materials excellent in electrical characteristics such as low dielectric constant, low temperature cureability, adhesion to metal, crack resistance, and moisture resistance has been sought.

To meet these demands, for example, Patent Document 1 discloses a radiation-sensitive resin composition containing a resin (A), a cross-linking agent (B) having an epoxy group, a cross-linking agent (C) having a triazine ring structure of glycoluril structure and having one or more functional groups selected from an imino group, methylol group, and alkoxybutyl group, and a radiation-sensitive compound (D). However, according to the radiation-sensitive resin composition described in this Patent Document 1, while it is possible to form a resin film excellent in electrical characteristics such as low dielectric constant, the film is not necessarily sufficient in adhesion to a metal layer of copper etc. There is therefore the problem that this could not be used for applications where such characteristics were demanded, for example, applications of insulating films for redistribution layers formed on surface protective films.

RELATED ART

Patent Documents

Patent Document 1: Japanese Patent Publication No. 2010-224533A

SUMMARY OF THE INVENTION

Problem to be Solved by the Invention

The present invention has as its object the provision of a radiation-sensitive resin composition able to give a resin film high in adhesion to a metal layer and excellent in developability and low hygroscopicity and an electronic device provided with a resin film comprised of such a radiation-sensitive resin composition.

Means for Solving the Problem

The inventors engaged in intensive research to achieve the above object and as a result discovered that it is possible to achieve the above object by mixing a tetrafunctional or lower functional epoxy-based cross-linking agent having an epoxy equivalent of 450 or less and a softening point of 30° C. or less, and an aralkyl phenol resin together with the binder resin and a radiation-sensitive compound and thereby completed the present invention.

That is, according to the present invention, there are provided:

[1] A radiation-sensitive resin composition comprising a binder resin (A), a radiation-sensitive compound (B), a tetrafunctional or lower functional epoxy-based cross-linking agent (C) having an epoxy equivalent of 450 or less and a softening point of 30° C. or less, and an aralkyl phenol resin (D),

[2] the radiation-sensitive resin composition according to [1] wherein the binder resin (A) is a cyclic olefin polymer having a protonic polar group,

[3] the radiation-sensitive resin composition according to [1] or [2] wherein a content of the epoxy-based cross-linking agent (C) is 5 to 80 parts by weight with respect to 100 parts by weight of the binder resin (A),

[4] the radiation-sensitive resin composition according to any one of [1] to [3] wherein the aralkyl phenol resin (D) is a compound represented by the following general formula (5):

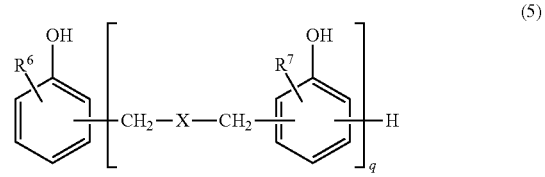

(5)

wherein, in the general formula (5), $R^6$ and $R^7$ respectively independently are a hydrogen atom or alkyl group having 1 to 12 carbon atoms and "q" is a positive number of 1 to 50, preferably a positive number of 1 to 25. Further, in the formula, X is any group represented by the following general formulas (6) to (8):

(6)

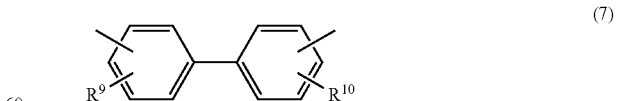

(7)

(8)

wherein, in the general formulas (6) to (8), $R^8$ to $R^{12}$ respectively independently are a hydrogen atom or alkyl group having 1 to 12 carbon atoms,

[5] the radiation-sensitive resin composition according to any one of [1] to [4] wherein a content of the aralkyl phenol resin (D) is 1 to 100 parts by weight with respect to 100 parts by weight of the binder resin (A),

[6] the radiation-sensitive resin composition according to any one of [1] to [5] further comprising a methoxymethyl group-containing cross-linking agent (E),

[7] the radiation-sensitive resin composition according to any one of [1] to [6] further comprising a silane coupling agent (F),

[8] the radiation-sensitive resin composition according to any one of [1] to [7], wherein a content of the silane coupling agent (F) is 0.01 to 100 parts by weight with respect to 100 parts by weight of the binder resin (A), and

[9] an electronic device containing a resin film, comprising a radiation-sensitive, resin composition according to any one of [1] to [8].

Effects of the Invention

According to the present invention, it is possible to provide a radiation-sensitive resin, composition able to give a resin film high in adhesion to a metal layer and excellent in developability and low hygroscopicity and an electronic device provided with a resin film comprised of such a radiation-sensitive resin composition.

DESCRIPTION OF EMBODIMENTS

The radiation-sensitive resin composition of the present invention contains a binder resin (A), a radiation-sensitive compound (B), a tetrafunctional or lower functional epoxy-based cross-linking agent (C) having an epoxy equivalent of 450 or less and a softening point of 30° C. or less, and an aralkyl phenol resin (D).

(Binder Resin (A))

The binder resin (A) used in the present invention is not particularly limited, but a cyclic olefin polymer which has a protonic polar group (A1), an acrylic resin (A2), polyimide (A3), Cardo resin (A4), or polysiloxane (A5) is preferable. Among these as well, a cyclic olefin polymer which has a protonic polar group (A1) is particularly preferable.

These binder resins (A) may respectively be used alone, or as two types or more combined.

As the cyclic olefin polymer which has a protonic polar group (A1) (below, simply referred to as the "cyclic olefin polymer (A1)"), a polymer of one or more cyclic olefin monomers or a copolymer of one or more cyclic olefin monomers and a monomer which can copolymerize with them may be mentioned, but in the present invention, as the monomer for forming the cyclic olefin polymer (A1), it is preferable to use at least a cyclic olefin monomer which has a protonic polar group (a).

Here, the "protonic polar group" means a group which contains an atom belonging to Group XV or Group XVI of the Periodic Table to which a hydrogen atom directly bonds. Among the atoms belonging to Group XV or Group XVI of the Periodic Table, atoms belonging to Period 1 or Period 2 of Group XV or Group XVI of the Period Table are preferable, an oxygen atom, nitrogen atom, or sulfur atom is more preferable, and an oxygen atom is particularly preferable.

As specific examples of such a pronotic polar group, a hydroxyl group, carboxy group (hydroxycarbonyl group), sulfonic acid group, phosphoric acid group, and other polar groups which have oxygen atoms; primary amino group, secondary amino group, primary amide group, secondary amide group (imide group), and other polar groups which have nitrogen atoms; a thiol group and other polar groups which have sulfur atoms; etc. may be mentioned. Among these as well, ones which have oxygen atoms are preferable, carboxy group is more preferable.

In the present invention, the number of protonic polar groups which bond with the cyclic olefin resin which has protonic polar groups is not particularly limited. Further, different types of protonic polar groups may also be included.

As specific examples of the cyclic olefin monomer which has a protonic polar group (a) (below, suitably called the "monomer (a)"), acarboxy group-containing cyclic olefin such as 2-hydroxycarbonylbicyclo[2.2.1]hept-5-ene, 2-methyl-2-hydroxycarbonylbicyclo[2.2.1]hept-5-ene, 2-carboxymethyl-2-hydroxycarbonylbicyclo[2.2.1]hept-5-ene, 2-hydroxycarbonyl-2-methoxycarbonylmethylbicyclo[2.2.1]hept-5-ene, 2-hydroxycarbonyl-2-ethoxycarbonylmethylbicyclo[2.2.1]hept-5-ene, 2-hydroxycarbonyl-2-propoxycarbonylmethylbicyclo[2.2.1]hept-5-ene, 2-hydroxycarbonyl-2-butoxycarbonylmethylbicyclo[2.2.1]hept-5-ene, 2-hydroxycarbonyl-2-pentyloxycarbonylmethylbicyclo[2.2.1]hept-5-ene, 2-hydroxycarbonyl-2-hexyloxycarbonylmethylbicyclo[2.2.1]hept-5-ene, 2-hydroxycarbonyl-2-cyclohexyloxycarbonylmethylbicyclo[2.2.1]hept-5-ene, 2-hydroxycarbonyl-2-phenoxycarbonylmethylbicyclo[2.2.1.]hept-5-ene, 2-hydroxycarbonyl-2-naphthyloxycarbonylmethylbicyclo[2.2.1]hept-5-ene, 2-hydroxycarbonyl-2-biphenyloxycarbonylmethylbicyclo[2.2.1]hept-5-ene, 2-hydroxycarbonyl-2-benzyloxycarbonylmethylbicyclo[2.2.1]hept-5-ene, 2-hydroxycarbonyl-2-hydroxyethoxycarbonylmethylbicyclo[2.2.1]hept-5-ene, 2,3-dihydroxycarbonylbicyclo[2.2.1]hept-5-ene, 2-hydroxycarbonyl-3-methoxycarbonylbicyclo[2.2.1]hept-5-ene, 2-hydroxycarbonyl-3-ethoxycarbonylbicyclo[2.2.1]hept-5-ene, 2-hydroxycarbonyl-3-propoxycarbonylbicyclo[2.2.1]hept-5-ene, 2-hydroxycarbonyl-3-butoxycarbonylbicyclo[2.2.1]hept-5-ene, 2-hydroxycarbonyl-3-pentyloxycarbonylbicyclo[2.2.1]hept-5-ene, 2-hydroxycarbonyl-3-hexyloxycarbonylbicyclo[2.2.1]hept-5-ene, 2-hydroxycarbonyl-3-cyclohexyloxycarbonylbicyclo[2.2.1]hept-5-ene, 2-hydroxycarbonyl-3-phenoxycarbonylbicyclo[2.2.1]hept-5-ene, 2-hydroxycarbonyl-3-naphthyloxycarbonylbicyclo[2.2.1]hept-5-ene, 2-hydroxycarbonyl-3-biphenyloxycarbonylbicyclo[2.2.1]hept-5-ene, 2-hydroxycarbonyl-3-benzyloxycarbonylbicyclo[2.2.1]hept-5-ene, 2-hydroxycarbonyl-3-hydroxyethoxycarbonylbicyclo[2.2.1]hept-5-ene, 2-hydroxycarbonyl-3-hydroxycarbonylmethylbicyclo[2.2.1]hept-5-ene, 3-methyl-2-hydroxycarbonylbicyclo[2.2.1]hept-5-ene, 3-hydroxycarbonyl-2-hydroxycarbonylbicyclo[2.2.1]hept-5-ene, 2-hydroxycarbonyltricyclo[5.2.1.0$^{2,6}$]deca-3,8-diene, 4-hydroxycarbonyltetracyclo[6.2.1.1$^{3,6}$.0$^{2,7}$]dodec-9-ene, 4-methyl-4-hydroxycarbonyltetracyclo[6.2.1.1$^{3,6}$.0$^{2,7}$]dodec-9-ene, 4,5-dihydroxycarbonyltetracyclo[6.2.1.1$^{3,6}$.0$^{2,7}$]dodec-9-ene, 4-carboxymethyl-4-hydroxycarbonyltetracyclo[6.2.1.1$^{3,6}$.0$^{2,7}$]dodec-9-ene, N-(hydroxycarbonylmethyl)bicyclo[2.2.1]hept-5-ene-2,3-dicarboxyimide, N-(hydroxycarbonylethyl)bicyclo[2.2.1]hept-5-ene-2,3-dicarboxyimide, N-(hydroxycarbonylpentyl)bicyclo[2.2.1]hept-5-ene-2,3-dicarboxyimide, N-(dihydroxycarbonylethyl)bicyclo[2.2.1]hept-5-ene-2,3-dicarboxyimide, N-(dihydroxycarbonylpropyl)bicyclo[2.2.1]hept-5-ene-2,3-dicarboxyimide, N-(hydroxycarbonylphenethyl)bicyclo[2.2.1]hept-5-ene-2,3-dicarboxyimide, N-(2-(4-hydroxyphenyl)-1-(hydroxycarbonyl)ethyl)bicyclo[2.2.1]hept-5-ene-2,3-dicarboxyimide, and N-(hydroxycarbonylphenyl)bicyclo[2.2.1]hept-5-ene-2,3-dicarboxyimide; a hydroxyl group-containing cyclic olefin such as 2-(4-hydroxyphenyl)bicyclo[2.2.1]hept-5-ene, 2-methyl-2-(4-hydroxyphenyl)bicyclo[2.2.1]hept-5-ene, 4-(4-hydroxyphenyl)tetracyclo[6.2.1.1$^{3,6}$.0$^{2,7}$]dodec-9-ene, 4-methyl-4-(4-hydroxyphenyl)tetracyclo[6.2.1.1$^{3,6}$.0$^{2,7}$]dodec-9-ene, 2-hydroxybicyclo[2.2.1]hept-5-ene, 2-hydroxymethylbicyclo[2.2.1]hept-5-ene, 2-hydroxyethylbicyclo[2.2.1]hept-5-ene, 2-methyl-2-hydroxymethylbicyclo[2.2.1]hept-5-ene, 2,3-dihydroxymethylbicyclo[2.2.1]hept-5-ene, 2-(hydroxyethoxycarbonyl)bicyclo[2.2.1]hept-5-ene, 2-methyl-2-(hydroxyethoxycarbonyl)bicyclo[2.2.1]hept-5-ene, 2-(1-hydroxy-1-trifluoromethyl-2,2,2-trifluoroethyl)bicyclo[2.2.1]hept-5-ene, 2-(2-hydroxy-2-trifluoromethyl-3,3,3-trifluoropropyl)bicyclo[2.2.1]hept-5-ene, 3-hydroxytricyclo[5.2.1.0$^{2,6}$]deca-4,8-diene, 3-hydroxymethyltricyclo[5.2.1.0$^{2,6}$]deca-4,8-diene, 4-hydroxytetracyclo[6.2.1.1$^{3,6}$.0$^{2,7}$]dodec-9-ene, 4-hydroxymethyltetracyclo[6.2.1.1$^{3,6}$.0$^{2,7}$]dodec-9-ene, 4,5-dihydroxymethyltetracyclo[6.2.1.1$^{3,6}$.0$^{2,7}$]dodec-9-ene, 4-(hydroxyethoxycarbonyl)tetracyclo[6.2.1.1$^{3,6}$.0$^{2,7}$]dodec-9-ene, 4-methyl-4-(hydroxyethoxycarbonyl)tetracyclo[6.2.1.1$^{3,6}$.0$^{2,7}$]dodec-9-ene, N-hydroxyethyl)bicyclo[2.2.1]hept-5-ene, 2,3-dicarboxyimide, and N-(hydroxyphenyl)bicyclo[2.2.1]hept-5-ene-2,3-dicarboxyimide etc. may be mentioned. Among these as well, from the viewpoint of the adhesion of the obtained resin film becoming higher, carboxy group-containing cyclic olefins are preferable, while 4-hydroxycarbonyltetracyclo[6.2.1.1$^{3,6}$.0$^{2,7}$]dodec-9-ene is particularly preferable. These monomers (a) may respectively be used along or may be use as two types or more combined.

In the cyclic olefin polymer (A1), the ratio of content of the units of the monomer (a) is preferably 10 to 90 mol % with respect to all monomer units, more preferably 20 to 80 mol %, still more preferably 30 to 70 mol %. If the ratio of content of the units of the monomer (a) is too small, the radiation sensitivity is liable to become insufficient and undissolved residue is liable to be formed at the time of development, if too great, the cyclic olefin polymer (A1) is liable to become insufficient in solubility in a polar solvent.

Further, the cyclic olefin polymer (A1) used in the present invention may be a copolymer which is obtained by copolymerization of a cyclic olefin monomer which has a protonic polar group (a) and a monomer (b) which can copolymerize with this. As such a copolymerizable monomer, a cyclic olefin monomer which has a polar group other than a protonic polar group (b1), a cyclic olefin monomer which does not have a polar group (b2), and a monomer other than a cyclic olefin (b3) (below, suitably called the "monomer (b1)", "monomer (b2)", and "monomer (b3)") may be mentioned.

As the cyclic olefin monomer which has a polar group other than a protonic polar group (b1), for example, a cyclic olefin which has an N-substituted imide group, ester group, cyano group, acid anhydride group, or halogen atom nay be mentioned.

As a cyclic olefin which has an N-substituted imide group, for example, a monomer represented by the following formula (1) or a monomer represented by the following formula (2) may be mentioned.

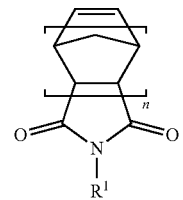

(1)

(In the above formula (1), $R^1$ indicates a hydrogen atom or alkyl group or aryl group having 1 to 16 carbon atoms, "n" indicates an integer of 1 to 2.)

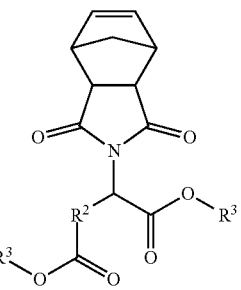

(2)

(In the above formula (2), $R^2$ indicates a bivalent alkylene group having 1 to 3 carbon atoms, while $R^3$ indicates a monovalent alkyl group having 1 to 10 carbon atoms or a monovalent halogenated alkyl group having 1 to 10 carbon atoms.)

In the above formula (1), $R^1$ is an alkyl group or aryl group having 1 to 16 carbon atoms. As specific examples of the alkyl group, a methyl group, ethyl group, n-propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, and other straight chain alkyl groups; cyclopropyl group, cyclobutyl group, cyclopentyl group, cyclohexyl group, cycloheptyl group, cyclooctyl group, cyclononyl group, cyclodecyl group, cycloundecyl group, cyclododecyl group, norbornyl group, bornyl group, isobornyl group, decahydronaphthyl group, tricyclodecanyl group, adamantyl group, and other cyclic alkyl groups; 2-propyl group, 2-butyl group, 2-methyl-1-propyl group, 2-methyl-2-propyl group, 1-methylbutyl group, 2-methylbutyl group, 1-methylpentyl group, 1-ethylbutyl group, 2-methylhexyl group, 2-ethylhexyl group, 4-methylheptyl group, 1-methylnonyl group, 1-methyltridecyl group, 1-methyltetradecyl group, and other branched alkyl groups; etc. may be mentioned. Further, as specific examples of the aryl group, a benzyl group etc. may be mentioned. Among these as well, due to the more excellent heat resistance and solubility in a polar solvent, an alkyl group and aryl group having 1 to 14 carbon atoms are preferable, while an alkyl group and aryl group having 6 to 10 carbon atoms are more preferable. If the number of carbon atoms is 4 or less, the solubility in a polar solvent is inferior, while if the number of carbon atoms is 17 or more, the heat resistance is inferior. Further, when patterning the resin film there is the problem that the resin film melts by heat and the patterns to end up disappearing.

As specific examples of the monomer represented by the above general formula (1), bicyclo[2.2.1]-hept-5-ene-2,3- dicarboxyimide, N-phenyl-bicyclo[2.2.1]hept-5-ene-2,3-dicarboxyimide, N-methylbicyclo[2.2.1]hept-5-ene-2,3-dicarboxyimide, N-ethylbicyclo[2.2.1]hept-5-ene-2,3-dicarboxyimide, N-propylbicyclo[2.2.1]hept-5-ene-2,3-dicarboxyimide, N-butylbicyclo[2.2.1]hept-5-ene-2,3-dicarboxyimide, N-cyclohexylbicyclo[2.2.1]hept-5-ene-2,3-dicarboxyimide, N-adamantylbicyclo[2.2.1]hept-5-ene-2,3-dicarboxyimide, N-(1-methylbutyl)-bicyclo[2.2.1]hept-5-ene-2,3-dicarboxyimide, N-(2-methylbutyl)-bicyclo[2.2.1]hept-5-ene-2,3-dicarboxyimide, N-(1-methylpentyl)-bicyclo[2.2.1]hept-5-ene-2,3-dicarboxyimide, N-(2-methylpentyl)-bicyclo[2.2.1]hept-5-ene-2,3-dicarboxyimide, N-(1-ethylbutyl)-bicyclo[2.2.1]hept-5-ene-2,3-dicarboxyimide, N-(2-ethylbutyl)-bicyclo[2.2.1]hept-5-ene-2,3-dicarboxyimide, N-(1-methylhexyl)-bicyclo[2.2.1]hept-5-ene-2,3-dicarboxyimide, N-(2-methylhexyl)-bicyclo[2.2.1]hept-5-ene-2,3-dicarboxyimide, N-(3-methylhexyl)-bicyclo[2.2.1]hept-5-ene-2,3-dicarboxyimide, N-(1-butylpentyl)-bicyclo[2.2.1]hept-5-ene-2,3-dicarboxyimide, N-(2-butylpentyl)-bicyclo[2.2.1]hept-5-ene-2,3-dicarboxyimide, N-(1-methylheptyl)-bicyclo[2.2.1]hept-5-ene-2,3-dicarboxyimide, N-(2-methylheptyl)-bicyclo[2.2.1]hept-5-ene-2,3-dicarboxyimide, N-(3-methylheptyl)-bicyclo[2.2.1]hept-5-ene-2,3-dicarboxyimide, N-(4-methylheptyl)-bicyclo[2.2.1]hept-5-ene-2,3-dicarboxyimide, N-(1-ethylhexyl)-bicyclo[2.2.1]hept-5-ene-2,3-dicarboxyimide, N-(2-ethylhexyl)-bicyclo[2.2.1]hept-5-ene-2,3-dicarboxyimide, N-(3-ethylhexyl)-bicyclo[2.2.1]hept-5-ene-2,3-dicarboxyimide, N-(1-propylpentyl)-bicyclo[2.2.1]hept-5-ene-2,3-dicarboxyimide, N-(2-propylpentyl)-bicyclo[2.2.1]hept-5-ene-2,3-dicarboxyimide, N-(1-methyloctyl)-bicyclo[2.2.1]hept-5-ene-2,3-dicarboxyimide, N-(2-methyloctyl)-bicyclo[2.2.1]hept-5-ene-2,3-dicarboxyimide, N-(3-methyloctyl)-bicyclo[2.2.1]hept-5-ene-2,3-dicarboxyimide, N-(4-methyloctyl)-bicyclo[2.2.1]hept-5-ene-2,3-dicarboxyimide, N-(1-ethylheptyl-bicyclo[2.2.1]hept-5-ene-2,3-dicarboxyimide, N-(2-ethylheptyl)-bicyclo[2.2.1]hept-5-ene-2,3-dicarboxyimide, N-(3-ethylheptyl)-bicyclo[2.2.1]hept-5-ene-2,3-dicarboxyimide, N-(4-ethylheptyl)-bicyclo[2.2.1]hept-5-ene-2,3-dicarboxyimide, N-(1-propylhexyl)-bicyclo[2.2.1]hept-5-ene-2,3-dicarboxyimide, N-(2-propylhexyl)-bicyclo[2.2.1]hept-5-ene-2,3-dicarboxyimide, N-(3-propylhexyl)-bicyclo[2.2.1]hept-5-ene-2,3-dicarboxyimide, N-(1-methylnonyl)-bicyclo[2.2.1]hept-5-ene-2,3-dicarboxyimide, N-(2-methylnonyl)-bicyclo[2.2.1]hept-5-ene-2,3-dicarboxyimide, N-(3-methylnonyl)-bicyclo[2.2.1]hept-5-ene-2,3-dicarboxyimide, N-(4-methylnonyl)-bicyclo[2.2.1]hept-5-ene-2,3-dicarboxyimide, N-(5-methylnonyl)-bicyclo[2.2.1]hept-5-ene-2,3-dicarboxyimide, N-(1-ethyloctyl)-bicyclo[2.2.1]hept-5-ene-2,3-dicarboxyimide, N-(2-ethyloctyl)-bicyclo[2.2.1]hept-5-ene-2,3-dicarboxyimide, N-(3-ethyloctyl)-bicyclo[2.2.1]hept-5-ene-2,3-dicarboxyimide, N-(4-ethyloctyl)-bicyclo[2.2.1]hept-5-ene-2,3-dicarboxyimide, N-(1-methyldecyl)-bicyclo[2.2.1]hept-5-ene-2,3-dicarboxyimide, N-(2-methyldodecyl)-bicyclo[2.2.1]hept-5-ene-2,3-dicarboxyimide, N-(1-methylundecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methyltridecyl)-bicyclo[2.2.1]hept-5-ene-2,3-dicarboxyimide, N-(1-methyltetradecyl)-bicyclo[2.2.1]hept-5-ene-2,3-dicarboxyimide, N-(1-methylpentadecyl)-bicyclo[2.2.1]hept-5-ene-2,3-dicarboxyimide, N-phenyl-tetracyclo[6.2.1.1$^{3,6}$.0$^{2,7}$]dodec-9-ene-4,5-dicarboxyimide, N-(2,4-dimethoxyphenyl)-tetracyclo[6.2.1.1$^{3,6}$.0$^{2,7}$]dodec-9-ene-4,5-dicarboxyimide, etc. may be mentioned. Note that, these may respectively be used alone or may be used as two types or more combined.

On the other hand, in the above general formula (2), $R^2$ is a bivalent alkylene group having 1 to 3 carbon atoms. As the bivalent alkylene group having 1 to 3 carbon atoms, a methylene group, ethylene group, propylene group, and isopropylene group may be mentioned. Among these as well, due to the excellent polymerization activity, a methylene group and ethylene group are preferable.

Further, in the above general formula (2), $R^3$ is a monovalent alkyl group having 1 to 10 carbon atoms or monovalent halogenated alkyl group having 1 to 10 carbon atoms. As the monovalent alkyl group having 1 to 10 carbon atoms, for example, a methyl group, ethyl group, propyl group, isopropyl group, butyl group, sec-butyl group, tert-butyl group, hexyl group, cyclohexyl group, etc. may be mentioned. As the monovalent halogenated alkyl group having 1 to 10 carbon atoms, for example, a fluoromethyl group, chloromethyl group, bromomethyl group, difluoromethyl group, dichloromethyl group, difluoromethyl group, trifluoromethyl group, trichloromethyl group, 2,2,2-trifluoroethyl group, pentafluoroethyl group, heptafluoropropyl group, perfluorobutyl group, perfluoropentyl group, etc. may be mentioned. Among these as well, since the solubility in a polar solvent is excellent, as $R^3$, a methyl group or ethyl group is preferable.

Note that, the monomer represented by the above general formulas (1) and (2) can, for example, be obtained by an imidization reaction between a corresponding amine and 5-norbornene-2,3-dicarboxylic acid anhydride. Further, the obtained monomer can be efficiently isolated by separating and refining the reaction solution of the imidization reaction by a known method.

As the cyclic olefin which has an ester group, for example, 1-acetoxybicyclo[2.2.1]hept-5-ene, 2-acetoxymethylbicyclo[2.2.1]hept-5-ene, 2-methoxycarbonylbicyclo[2.2.1]hept-5-ene, 2-ethoxycarbonylbicyclo[2.2.1]hept-5-ene, 2-propoxycarbonylbicyclo[2.2.1]hept-5-ene, 2-butoxycarbonylbicyclo[2.2.1]hept-5-ene, 2-cyclohexyloxycarbonylbicyclo[2.2.1]hept-5-ene, 2-methyl-2-methoxycarbonylbicyclo[2.2.1]hept-5-ene, 2-methyl-2-ethoxycarbonylbicyclo[2.2.1]hept-5-ene, 2-methyl-2-propoxycarbonylbicyclo[2.2.1]hept-5-ene, 2-methyl-2-butoxycarbonylbicyclo[2.2.1]hept-5-ene, 2-methyl-2-cyclohexyloxycarbonylbicyclo[2.2.1]hept-5-ene, 2-(2,2,2-trifluoroethoxycarbonyl)bicyclo[2.2.1]hept-5-ene, 2-methyl-2-(2,2,2-trifluoroethoxycarbonyl)bicyclo[2.2.1]hept-5-ene, 2-methoxycarbonyltricyclo[5.2.1.0$^{2,6}$]dec-8-ene, 2-ethoxycarbonyltricyclo[5.2.1.0$^{2,6}$]dec-8-ene, 2-propoxycarbonyltricyclo[5.2.1.0$^{2,6}$]dec-8-ene, 4-acetoxytetracyclo[6.2.1.1$^{3,6}$.0$^{2,7}$]dodec-9-ene, 4-methoxycarbonyltetracyclo[6.2.1.1$^{3,6}$.0$^{2,7}$]dodec-9-ene, 4-ethoxycarbonyltetracyclo[6.2.1.1$^{3,6}$.0$^{2,7}$]dodec-9-ene, 4-propoxycarbonyltetracyclo[6.2.1.1$^{3,6}$.0$^{2,7}$]dodec-9-ene, 4-butoxycarbonyltetracyclo[6.2.1.1$^{3,6}$.0$^{2,7}$]dodec-9-ene, 4-methyl-4-methoxycarbonyltetracyclo[6.2.1.1$^{3,6}$.0$^{2,7}$]dodec-9-ene, 4-methyl-4-ethoxycarbonyltetracyclo[6.2.1.1$^{3,6}$.0$^{2,7}$]dodec-9-ene, 4-methyl-4-propoxycarbonyltetracyclo[6.2.1.1$^{3,6}$.0$^{2,7}$]dodec-9-ene, 4-methyl-4-butoxycarbonyltetracyclo[6.2.1.1$^{3,6}$.0$^{2,7}$]dodec-9-ene, 4-(2,2,2-trifluoroethoxycarbonyl)tetracyclo[6.2.1.1$^{3,6}$.0$^{2,7}$]dodec-9-ene, 4-methyl-4-(2,2,2-trifluoroethoxycarbonyl)tetracyclo[6.2.1.1$^{3,6}$.0$^{2,7}$]dodec-9-ene, etc. may be mentioned.

As the cyclic olefin which has a cyano group, for example, 4-cyanotetracyclo[6.2.1.1$^{3,6}$.0$^{2,7}$]dodec-9-ene, 4-methyl-4-cyanotetracyclo[6.2.1.1$^{3,6}$.0$^{2,7}$]dodec-9-ene, 4,5-dicyanotetracyclo[6.2.1.1$^{3,6}$.0$^{2,7}$]dodec-9-ene, 2-cyanobicyclo[2.2.1]hept-5-ene, 2-methyl-2-cyanobicyclo[2.2.1]hept-5-ene, 2,3-dicyanobicyclo[2.2.1]hept-5-ene, etc. may be mentioned.

As the cyclic olefin which has an acid anhydride group, for example, tetracyclo[6.2.1.1$^{3,6}$.0$^{2,7}$]dodec-9-ene-4,5-dicarboxylic anhydride, bicyclo[2.2.1]hept-5-ene-2,3-dicarboxylic anhydride, 2-carboxymethyl-2-hydroxycarbonhylbicyclo[2.2.1]hept-5-ene anhydride, etc. may be mentioned.

As the cyclic olefin which has a halogen atom, for example, 2-chlorobicyclo[2.2.1]hept-5-ene, 2-chloromethylbicyclo[2.2.1]hept-5-ene, 2-(chlorophenyl)bicyclo[2.2.1]hept-5-ene, 4-chlorotetracyclo[6.2.1.1$^{3,6}$.0$^{2,7}$]dodec-9-ene, 4-methyl-4-chlorotetracyclo[6.2.1.1$^{3,6}$.0$^{2,7}$]dodec-9-ene, etc. may be mentioned.

These monomers (b1) may respectively be used along or may be used as two types or more combined.

As the cyclic olefin monomer which does not have a polar group (b2), bicyclo[2.2.1]hept-2-ene (also called "norbornene"), 5-ethylbicyclo[2.2.1]hept-2-ene, 5-butyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene, tricyclo[5.2.1.0$^{2,6}$]deca-3,8-diene (common name: dicyclopentadiene), tetracyclo[10.2.1.0$^{2,11}$.0$^{4,9}$]pentadec-4,6,8,13-tetraene, tetracyclo[6.2.1.1$^{3,6}$.0$^{2,7}$]dodec-4-ene (also called "tetracyclododecene"), 9-methyl-tetracyclo[6.2.1.1$^{3,6}$.0$^{2,7}$]dodec-4-ene, 9-ethyl-tetracyclo[6.2.1.1$^{3,6}$.0$^{2,7}$]dodec-4-ene, 9-methylidene-tetracyclo[6.2.1.1$^{3,6}$.0$^{2,7}$]dodec-4-ene, 9-ethylidene-tetracyclo[6.2.1.1$^{3,6}$.0$^{2,7}$]dodec-4-ene, 9-vinyl-tetracyclo[6.2.1.1$^{3,6}$.0$^{2,7}$]dodec-4-ene, 9-propenyl-tetracyclo[6.2.1.1$^{3,6}$.0$^{2,7}$]dodec-4-ene, pentacyclo[9.2.1.1$^{3,9}$.0$^{2,10}$.0$^{4,8}$]pentadeca-5,12-diene, cyclobutene, cyclopentene, cyclopentadiene, cyclohexene, cycloheptene, cyclooctene, cyclooctadiene, indene, 3a,5,6,7a-tetrahydro-4,7-methano-1H-indene, 9-phenyl-tetracyclo[6.2.1.1$^{3,6}$.0$^{2,7}$]dodec-4-ene, tetracyclo[9.2.1.0$^{2,10}$.0$^{3,8}$]tetradec-3,5,7,12-tetraene, pentacyclo[9.2.1.1$^{3,9}$.0$^{2,10}$.0$^{4,8}$]pentadec-12-ene, etc. may be mentioned.

These monomers (b2) may respectively be used alone or may be used as two types or more combined.

As specific examples of the monomer other than a cyclic olefin (b3), ethylene; propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosene, and other C$_2$ to C$_{20}$ α-olefins; 1,4-hexadiene, 1,5-hexadiene, 4-methyl-1,4-hexadiene, 5-methyl-1,4-hexadiene, 1,7-octadiene, and other nonconjugated dienes and their derivatives; etc. may be mentioned. Among these as well, α-olefin is preferable.

These monomers (b3) may respectively be used along or may be used as two types or more combined.

Among these monomers (b1) to (b3) as well, from the view point of the effect of the present invention becoming more remarkable, a cyclic olefin monomer which has a polar group other than a protonic polar group (b1) is preferable, while a cyclic olefin which has an N-substituted imide group is particularly preferable.

In the cyclic olefin polymer (A1), the ratio of content of units of the copolymerizable monomer (b) is preferably 10 to 90 mol % with respect to the total monomer units, more preferably 20 to 80 mol %, still more preferably 30 to 70 mol %. If the ratio of content of the units of the copolymerizable monomer (b) is too small, the cyclic olefin polymer (A1) is liable to become insufficient in solubility in a polar solvent, while if too great, the radiation sensitivity is liable to become insufficient and undissolved residue is liable to be formed at the time of development.

Note that, in the present invention, it is also possible to introduce a protonic group in a cyclic olefin-based polymer which does not have a protonic polar group utilizing a known modifying agent so as to obtain the cyclic olefin polymer (A1).

The polymer which does not have a protonic polar group can be obtained by polymerizing at least one of the above-mentioned monomers (b1) and (b2) and, in accordance with need, a monomer (b3) in any combination.

As a modifying agent for introduction of a protonic polar group, usually a compound which has a protonic polar group and a reactive carbon-carbon unsaturated bond in a single molecule is used.

As specific examples of this compound, acrylic acid, methacrylic acid, angelic acid, tiglic acid, oleic acid, elaidic acid, erucic acid, brassidic acid, maleic acid, fumaric acid, citraconic acid, mesaconic acid, itaconic acid, atropic acid, cinnamic acid, or other unsaturated carboxylic acid; allyl alcohol, methylvinyl methanol, crotyl alcohol, methacryl alcohol, 1-phenylethen-1-ol, 2-propen-1-ol, 3-buten-1-ol, 3-buten-2-ol, 3-methyl-3-buten-1-ol, 3-methyl-2-buten-1-ol, 2-methyl-3-buten-2-ol, 2-methyl-3-buten-1-ol, 4-penten-1-ol, 4-methyl-4-penten-1-ol, 2-hexen-1-ol, or other unsaturated alcohol; etc. may be mentioned.

The modification reaction of a polymer in which these modifying agents are used may be performed in accordance with an ordinary method and is usually performed in the presence of a radical generator.

Note that, the cyclic olefin polymer (A1) used in the present invention may be a ring-opened polymer obtained by ring-opening polymerization of the above-mentioned monomers or may be an addition polymer obtained by addition polymerization of the above-mentioned monomers, but from the viewpoint of the effect of the present invention becoming more remarkable, a ring-opened polymer is preferable.

A ring-opened polymer can be produced by ring-opening methathesis polymerization of a cyclic olefin monomer which has a protonic polar group (a) and a copolymerizable monomer (b) used according to need in the presence of a methathesis reaction catalyst. As the method of production, for example, the method described in International Publication No. 2010/110323A, [0030] to [0079], etc. can be used.

Further, when the cyclic olefin polymer (A1) used in the present invention is a ring-opened polymer, it is preferable to further perform a hydrogenation reaction and obtain a hydrogenated product in which the carbon-carbon double bonds which are contained in the main chain are hydrogenated. When the cyclic olefin polymer (A1) is a hydrogenated product, the ratio of the hydrogenated carbon-carbon double bonds (hydrogenation rate) is usually 50% or more. From the viewpoint of the heat resistance, 70% or more is preferable, 90% or more is more preferable, and 95% or more is furthermore preferable.

Further, the acrylic resin (A2) used in the present invention is nor particularly limited, but a homopolymer or copolymer having at least one of a carboxylic acid which has an acryl group, carboxylic anhydride which has an acryl group, epoxy group-containing acrylate compound and oxetane group-containing acrylate compound as an essential ingredient is preferable.

As specific examples of the carboxylic acid which has an acryl group, (meth)acrylic acid (meaning acrylic acid and/or methacrylic acid, below, same for methyl(meth)acrylate etc.), crotonic acid, maleic acid, fumaric acid, citraconic acid, mesaconic acid, glutaconic acid, phthalic acid mono- (2-((meth)acryloyloxy)ethyl), N-(carboxyphenyl)maleimide, N-(carboxyphenyl)(meth)acrylamide, etc. may be mentioned.

As specific examples of the carboxylic anhydride which has an acryl group, maleic anhydride, citraconic anhydride, etc. may be mentioned.

As specific examples of the epoxy group-containing acrylate compound, glycidyl acrylate, glycidyl methacrylate, glycidyl α-ethyl acrylate, glycidyl α-n-propyl, acrylate, glycidyl α-n-butyl acrylate, 3,4-epoxybutyl acrylate, 3,4-epoxybutyl methacrylate, 6,7-epoxyheptyl acrylate, 6,7-epoxyheptyl methacryalte, 6,7-epoxyheptyl α-ethyacrylate, 3,4-epoxycycloheyxlmethyl acrylate, 3,4-epoxycyclohexylmethyl methacrylate, etc. may be mentioned.

As specific examples of the oxetane group-containing acrylate compound, (3-methyloxetan-3-yl)(meth)acrylate, (3-ethyloxetan-3-yl)methyl (meth)acrylate, (3-methyloxetan-3-yl)ethyl (meth)acrylate, (3-ethyloxetan-3-yl)ethyl (meth)acrylate, (3-chloromethyloxetan-3-yl)methyl (meth)acrylate, (oxetan-2-yl)methyl (meth)acrylate, (2-methyloxetan-2-yl)methyl (meth)acrylate, (2-ethyloxetan-2-yl)methyl (meth)acrylate, (1-methyl-1-oxetanyl-2-phenyl)-3-(meth)acrylate, (1-methyl-1-oxetanyl)-2-trifluoromethyl-3-(meth)acrylate, and (1-methyl-1-oxetanyl)-4-trifluoromethyl-2-(meth)acrylate, etc. may be mentioned.

Among these as well, (meth)acrylic acid, maleic anhydride, glycidyl (meth)acrylate, 6,7-epoxyheptyl methacrylate, etc. are preferable.

The acrylic resin (A2) may also be a copolymer of at least one compound which is selected from unsaturated carboxylic acids, unsaturated carboxylic anhydrides, and epoxy group-containing unsaturated compounds, and other acrylate-based monomers or copolymerizable monomers other than acrylates.

As other acrylate-based monomers, methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, amyl (meth)acrylate, isoamyl (meth)acrylate, hexyl (meth)acrylate, heptyl (meth)acrylate, octyl (meth)acrylate, isooctyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, and other alkyl (meth)acrylates; hydroxyethyl (meth)acrylate, 2-hydroxypropyl (meth) acrylate, 3-hydroxyprop-yl (meth)acrylate, 2-hydroxybutyl (meth)acrylate, 3-hydroxybutyl (meth)acrylate, 4-hydroxybutyl (meth)acrylate, and other hydroxyalkyl (meth)acrylates; phenoxyethyl (meth)acrylate, 2-hydroxy-3-phenoxypropyl (meth)acrylate, and other phenoxyalkyl (meth) acrylates; 2-methoxyethyl (meth)acrylate, 2-ethoxyethyl (meth)acrylate, 2-propoxyethyl (meth)acrylate, 2-butoxyethyl (meth)acrylate, 2-methoxybutyl (meth)acrylate, and other alkoxyalkyl (meth)acrylates; polyethylene glycol mono(meth)acrylate, ethoxydiethylene glycol (meth)acrylate, methoxypolyethylene glycol (meth)acrylate, phenoxypolyethylene glycol (meth)acrylate, nonyl phenoxypolyethylene glycol (meth)acrylate, polypropylene glycol mono (meth)acrylate, methoxypolypropylene glycol (meth) acrylate, ethoxypolypropylene glycol (meth)acrylate, nonylphenoxypolypropylene glycol (meth)acrylate, and other polyalkylene glycol (meth)acrylates; cyclohexyl (meth)acrylate, 2-methylcyclohexyl (meth)acrylate, 4-butylcyclohexyl (meth)acrylate, 1-adamantyl (meth)acrylate, 2-methyl-2-adamantyl (meth)acrylate, 2-ethyl-2-adamantyl (meth)acrylate, tricyclo[5.2.1.0$^{2,6}$]decan-8-yl (meth)acrylate, tricyclo[5.2.1.0$^{2,6}$]-3-decen-8-yl (meth)acrylate, tricyclo[5.2.1.0$^{2,6}$]-3-decen-9-yl (meth)acrylate, bornyl (meth)acrylate, isobornyl (meth)acrylate, and other cycloalkyl (meth)acrylates; phenyl (meth)acrylate, naphthyl (meth)acrylate, biphenyl (meth)acrylate, benzyl (meth)acrylate, tetrahydrofurfuryl (meth)acrylate, 5-tetrahydrofurfuryl oxycarbonylpentyl (meth)acrylate, vinyl (meth)acrylate, allyl (meth)acrylate, 2-(2-vinyloxyethoxy)ethyl (meth)acrylate, 2-[tricyclo[5.2.1.0$^{2,6}$]decan-8-yloxy]ethyl (meth)acrylate, 2-[tricyclo[5.2.1.0$^{2,6}$]-3-decen-8-yloxy]ethyl (meth)acrylate, 2-[tricyclo[5.2.1.0$^{2,6}$]-3-decen-9-yloxy]ethyl (meth) acrylate, γ-butyrolactone (meth)acrylate, maleimide, N-methylmaleimide, N-ethylmaleimide, N-butylmaleimide, N-cyclohexylmaleimide, N-benzylmaleimide, N-phenylmaleimide, N-(2,6-diethylphenyl)maleimide, N-(4-acetylphenyl)maleimide, N-(4-hydroxyphenyl)maleimide, N-(4-acetoxyphenyl)maleimide, N-(4-dimethylamino-3,5-dinitrophenyl)maleimide, N-(1-anilinonaphthyl-4) maleimide, N-[4-(2-benzooxazolyl)phenyl]maleimide, N-(9-acridinyl)maleimide, etc. may be mentioned.

Among these as well, methyl (meth)acrylate, butyl (meth)acrylate, cyclohexyl (meth)acrylate, 2-methylcyclohexyl (meth)acrylate, benzyl (meth)acrylate, tricyclo[5.2.1.0$^{2,6}$]decan-8-yl (meth)acrylate, N-phenylmaleimide, N-cyclohexylmaleimide, etc. are preferable.

The copolymerizable monomer other than acrylate is not particularly limited so long as a compound which can copolymerize with the above carboxylic acid which has an acryl group, carboxylic anhydride which has an acryl group, epoxy group-containing acrylate compound, but, for example, vinylbenzylmethyl ether, vinylglycidyl ether, styrene, α-methylstyrene, vinyltoluene, indene, vinylnaphthalene, vinylbiphenyl, chlorostyrene, bromostyrene, chloromethylstyrene, p-tert-butoxystyrene, p-hydroxystyrene, p-hydroxy-α-methylstyrene, p-acetoxystyrene, p-carboxystyrene, 4-hydroxyphenylvinylketone, acrylonitrile, methacrylonitrile, (meth)acrylamide, 1,2-epoxy-4-vinylcyclohexane, isobutene, norbornene, butadiene, isoprene, and other radical polymerizable compounds may be mentioned.

These compounds may respectively be used alone or may be used as two types or more combined.

The polymerization method of the above monomer may be an ordinary method. For example, the suspension polymerization method, the emulsion polymerization method, the solution polymerization method, etc. may be employed.

The polyimide (A3) used in the present invention can be obtained by heat treating a polyimide precursor obtained by reacting a tetracarboxylic anhydride and diamine. As the precursor for obtaining the polyimide, a polyamic acid, polyamic acid ester, polyisoimide, polyamic acid sulfonamide, etc. may be mentioned.

The polyimide (A3) used in the present invention is synthesized by a known method. That is, it is synthesized by a known method such as selectively combining tetracarboxylic dianhydride and a diamine and reacting these in N-methyl-2-pyrrolidone, N,N-dimethylacetoamide, N,N-dimethylformamide, dimethylsulfoxide, hexamethylphosphoric triamide, γ-butyrolactone, cyclopentanone, or other polar solvent.

When excessively using a diamine for polymerization, it is possible to make a carboxylic anhydride react with the end amino group of the produced polyimide (A3) so as to protect the end amino group. Further, when excessively using tetracarboxylic anhydride for polymerization, it is possible to make an amine compound react with the end acid anhydride group of the produced polyimide (A3) so as to protect the end acid anhydride group.

As examples of such carboxylic anhydrides, phthalic anhydride, trimellitic anhydride, maleic anhydride, naphthalic anhydride, hydrogenated phthalic anhydride, methyl-5-norbornene-2,3-dicarboxylic anhydride, itaconic anhydride, tetrahydrophthalic acid anhydride, etc. may be mentioned, while as examples of amine compounds, aniline, 2-hydroxyaniline, 3-hydroxyaniline, 4-hydroxyaniline, 2-ethynylaniline, 3-ethynylaniline, 4-ethynylaniline, etc. may be mentioned.

The Cardo resin (A4) used in the present invention is a resin which has a Cardo structure, that is, a skeletal structure with two cyclic structures bonded to a quaternary carbon atom which forms a cyclic structure. A general form of a Cardo structure is a structure in which benzene rings bond to a fluorene ring.

As specific examples of a skeletal structure where two cyclic structures are bonded to a quaternary carbon atom forming a cyclic structure, a fluorene skeleton, bisphenol fluorene skeleton, bisaminophenyl fluorene skeleton, fluorine skeleton having an epoxy group, fluorene skeleton having an acryl group, etc. may be mentioned.

The Cardo resin (A4) used in the present invention is formed by polymerization by reacting functional groups which bond to skeletons having Cardo structure each other. The Cardo resin (A4) has a structure where the main chain and bulky side chains are connected by a single element (Cardo structure) and has a cyclic structure in the direction substantially vertical to the main chain.

As one example of the Cardo structure, an example of a Cardo structure having an acrylate structure is shown in the following formula (3).

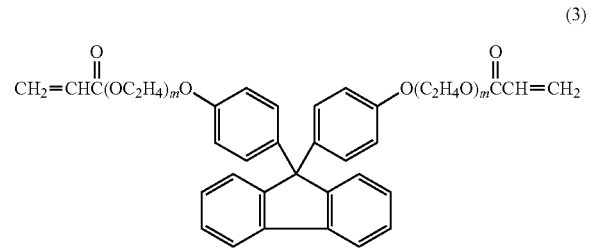

(3)

(In the above formula (3), "m" is an integer of 0 to 10.)

The monomer which has a Cardo structure is, for example, a bis(glycidyloxyphenyl)fluorene-type epoxy resin; a condensate of a bispheholfluorene-type epoxy resin and acrylic acid; 9,9-bis(4-hydroxyphenyl)fluorene, 9,9-bis(4-hydroxy-3-methylphenyl)fluorene, or other Cardo structure-containing bisphenols; 9,9-bis(cyanomethyl)fluorene or other 9,9-bis(cyanoalkyl)fluorenes; 9,9-bis(3-aminopropyl) fluorene or other 9,9-bis(aminoalkyl)fluorenes; etc. may be mentioned.

The Cardo resin (A4) is a polymer which is obtained by polymerization of a monomer which has a Cardo structure, but may also be a copolymer with another copolymerizable monomer.

The polymerization method of the above monomers may be an ordinary method. For example, the ring-opening polymerization method or addition polymerization method etc. may be employed.

The polysiloxane (A5) used in the present invention is not particularly limited, but preferably a polymer which is obtained by mixing and reacting one or more types of organosilane represented by the following formula (4) may be mentioned.

$$(R^4)_p-Si-(OR^5)_{4-p} \quad (4)$$

In the above formula (4), $R^4$ is a hydrogen atom, alkyl group having 1 to 10 carbon atoms, alkenyl group having 2 to 10 carbon atoms, aryl group having 6 to 15 carbon atoms. The plurality of $R^4$ may be the same or different. Note that, these alkyl groups, alkenyl groups, and aryl groups may all have substituents. Further, they may be nonsubstituted groups which do not have substituents and may be selected in accordance with the properties of the composition. As specific examples of the alkyl group, a methyl group, ethyl group, n-propyl group, isopropyl group, n-butyl group, t-butyl group, n-hexyl group, n-decyl group, trifluoromethyl group, 2,2,2-trifluoroethyl group, 3,3,3-trifluoropropyl group, 3-glycidoxypropyl group, 2-(3,4-epoxy cyclohexyl) ethyl group, 3-aminopropyl group, 3-mercaptopropyl group, and 3-isocyanatepropyl group may be mentioned. As specific examples of the alkenyl group, a vinyl group, 3-acryloxypropyl group, and 3-methacryloxypropyl group may be mentioned. As specific example of the aryl group, a phenyl group, tolyl group, p-hydroxyphenyl group, 1-(p-hydroxyphenyl)ethyl group, 2-(p-hydroxyphenyl)ethyl group, 4-hydroxy-5-(p-hydroxyphenylcarbonyloxy)pentyl group, and naphthyl group may be mentioned.

Further, in the above general formula (4), $R^5$ is a hydrogen atom, alkyl group having 1 to 6 carbon atoms, acyl group having 1 to 6 carbon atoms, aryl group having 6 to 15 carbon atoms, where the plurality of $R^5$ may be the same or different. Note that, these alkyl groups and acyl groups may all have substituents. Further, they may be nonsubstituted groups which do not have substituents and may be selected in accordance with the properties of the composition. As specific examples of the alkyl group, a methyl group, ethyl group, n-propyl group, isopropyl group, and n-butyl group may be mentioned. As a specific example of the acyl group, an acetyl group may be mentioned. As a specific example of an aryl group, a phenyl group may be mentioned.

Furthermore, in the above general formula (4), "p" is an integer of 0 to 3. When p=0, the compound becomes tetrafunctional silane, when p=1, it becomes trifunctional silane, when p=2, it becomes bifunctional silane, and when p=3, it becomes monofunctional silane.

As specific examples of an organosilane represented by the above general formula (4), tetramethoxysilane, tetraethoxysilane, tetraacetoxysilane, tetraphenoxysilane, or other tetrafunctional silanes; methyltrimethoxysilane, methyltriethoxysilane, methyltriisopropoxysilane, methyltri-n-butoxysilane, ethyltrimetoxysilane, ethyltriethoxysilane, ethyltriisopropoxysilane, ethyltri-n-butoxysilane, n-propyltrimetoxysilane, n-propyltriethoxysilane, n-butyltrimetoxysilane, n-butyltriethoxysilane, n-hexyltrimethoxysilane, n-hexyltriethoxysilane, decyltrimetoxysilane, vinyltrimethnoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 2-(3,4-epoxy cyclohexyl)ethyltrimethoxysilane, 3-mercaptopropyltrimethoxysilane, or other trifunctional silanes; dimethyldimethoxysilane, dimethyldiethoxysilane, dimethyldiacetoxysilane, di-n-butyldimethoxysilane, diphenyldimethoxysilane, or other bifunctional silanes; trimethylmethoxysilane, tri-n-butylethoxysilane, or other monofunctional silanes; may be mentioned.

Among these organosilanes, from the viewpoint of the crack resistance or hardness of the obtained resin film, trifunctional silanes are preferably used. These organosilanes may be used along or may be used as two types or more combined.

The polysiloxane (A5) used in the present invention is obtained by the hydrolysis or partial condensation of the above-mentioned organosilanes. For the hydrolysis and partial condensation, general methods can be used. For example, a solvent, water, and according to need a catalyst are added to the mixture and heated and stirred. During stirring, in accordance with need, distillation may be used to distill off the hydrolysis byproducts (methanol or other alcohol) or condensation byproduct (water).

The binder resin (A) used in the present invention has a weight average molecular weight (Mw) of usually 1,000 to 1,000,000, preferably 1,500 to 100,000, more preferably 2,000 to 30,000 in range.

Further, the binder resin (A) has a molecular weight distribution of a weight average molecular weight/number average molecular weight (Mw/Mn) ratio of usually 4 or less, preferably 3 or less, more preferably 2.5 or less.

The weight average molecular weight (Mw) and molecular weight distribution (Mw/Mn) of the binder resin (A) are values which are found by gel permeation chromatography (GPC) using tetrahydrofuran and other solvents as eluents and as value converted to polystyrene.

(Radiation-Sensitive Compound (B))

The radiation-sensitive compound (B) is a compound able to undergo a chemical reaction by being irradiated by electromagnetic radiation such as ultraviolet rays or electron beams. In the present invention, the radiation-sensitive compound (B) preferably is one in which the alkali solubility of a resin film formed from the radiation-sensitive resin composition can be controlled, in particular preferably uses a photo acid generator.

As such a radiation-sensitive compound (B), for example, an acetophenone compound, triarylsulfonium salt, and an azide compound such as a quinone diazide compound may be mentioned, but preferably it is an azide compound, particularly preferably a quinone diazide compound.

As a quinone diazide compound, for example, an ester compound of a quinone diazide sulfonic acid halide and a compound which has a phenolic hydroxyl group can be used. As specific examples of the quinone diazide sulfonic acid halide, 1,2-naphthoquinone diazide-5-sulfonic acid chloride, 1,2-naphthoquinone diazide-4-sulfonic acid chloride, 1,2-benzoquinone diazide-5-sulfonic acid chloride, etc. may be mentioned. As typical examples of a compound which has a phenolic hydroxyl group, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, etc. may be mentioned. As other compounds which have phenolic hydroxyl groups, 2,3,4-trihydroxybenzophenone, 2,3,4,4'-tetrahydroxybenzophenone, 2-bis(4-hydroxyphenyl)propane, tris(4-hydroxyphenyl)methane, 1,1,1-tris(4-hydroxy-3-methylphenyl)ethane, 1,1,2,2-tetrakis(4-hydroxyphenyl)ethane, oligomers of novolac resins, oligomers obtained by copolymerization of a compound which has one or more phenolic hydroxyl groups and dicyclopentadiene, etc. may be mentioned.

Further, as the photo acid generator, in addition to a quinone diazide compound, a known one such as an onium salt, halogenated organic compound, α,α'-bis(sulfonyl) dizaomethane-based compound, α-carbonyl-α'-sulfonyldiazomethane-based compound, sulfone compound, organic acid ester compound, organic acid amide compound, organic acid imide compound, etc. may be used.

These radiation-sensitive compounds may be used along or as two types or more combined.

In the radiation-sensitive resin composition of the present invention, the content of the radiation-sensitive compound (B) is preferably 10 to 100 parts by weight with respect to 100 parts by weight of the binder resin (A), more preferably 15 to 70 parts by weight, still more preferably 25 to 50 parts by weight. By making the content of the radiation-sensitive compound (B) this range, it is possible to make the resin film obtained using the radiation-sensitive resin composition of the present invention, better in adhesion to a metal layer and excellent in developability and low hydroscopicity.

(Epoxy-Based Cross-Linking Agent (C))

The radiation-sensitive resin composition of the present invention contains a tetrafunctional or lower functional epoxy-based cross-linking agent (C) having an epoxy equivalent of 450 or less and a softening point of 30° C. or less in addition to the above-mentioned binder resin (A) and radiation-sensitive compound (B).

The epoxy-based cross-linking agent (C) is not particularly limited so long as one having an epoxy equivalent of 450 or less, having a softening point of 30° C. or less, and having a tetrafunctional or lower functional structure. By mixing such an epoxy-based cross-linking agent together with the later explained aralkyl phenol resin (D), it is possible to make the obtained resin film one high in adhesion to a metal layer and excellent in developability and low hydroscopicity.

If using an epoxy compound with an epoxy equivalent of over 450, the obtained resin film ends up becoming inferior in alkali development characteristics. The epoxy equivalent of the epoxy-based cross-linking agent (C) is preferably 420 or less. Note that, the lower limit of the epoxy equivalent is not particularly limited, but is preferably 80 or more. Further, if using an epoxy compound with a softening point of over 30° C., the effect of improvement of the adhesion with a metal layer and developability can no longer be obtained. The softening point of the epoxy-based cross-linking agent (C) is preferably 25° C. or less. That is, as the epoxy-based cross-linking agent (C), on which is liquid in state at ordinary temperature (25° C.) is preferable. Note that, the lower limit of the softening point of the epoxy-based cross-linking agent (C) is not particularly limited. So long as exhibiting a liquid state at ordinary temperature (25° C.), the softening point is not particularly limited. Furthermore, if using a pentafunctional or higher functional epoxy compound, the obtained resin film ends up inferior in metal adhesion. For this reason, the epoxy-based cross-linking agent (C) of the present invention need be a tetrafunctional one or lower functional, but one with two to four functional groups is preferable.

Note that, the epoxy equivalent of the epoxy-based cross-linking agent (C), for example, can be measured in accordance with JIS K 7236 "Method of Finding Epoxy Equivalent of Epoxy Resin." Further, the softening point of the epoxy-based cross-linking agent (C) can be measured in accordance with, for example, JIS K 2207.

An specific examples of the epoxy-based cross-linking agent (C) used in the present invention, for example, an epoxy compound having an alicyclic structure such as epoxylated 3-cyclohexene-1,2-dicarboxylic acid bis(3-cyclohexenylmethyl)-modified ε-caprolactone (aliphatic cyclic trifunctional epoxy resin, product name "Epolide GT301", made by Daicel Chemical Industries), epoxylated butanetetracarboxylic acid tetrakis(3-cyclohexenylmethyl)-modified ε-captrolactone (aliphatic cyclic tetrafunctional epoxy resin, product name "Epolide GT401", made by Daicel Chemical Industries), 3,4-epoxy cyclohexenylmethyl-3',4'-epoxy cyclohexehecarboxylate (product names "Celloxide 2021", "Celloxide 2021P", made by Daicel Chemical Industries), 1,2:8,9-diepoxy limonene (product name "Celloxide 3000", made by Daicel Chemical Industries), and 2-(3,4-epoxy cyclohexyl)ethyltrimethoxysilane (produce name "Z-6043", made by Dow Corning Toray) and an epoxy compound not having an alicyclic structure such as a bisphenol A type epoxy compound (product names "jER 825", "jER 827", "jER 828", and "jER YL980", made by Mitsubishi Chemical and product names "EPICLON 840" and "EPICLON 850", made by DIC), a bisphenol F type epoxy compound (product names "jER 806", "jER 807", and "jER YL983U", made by Mitsubishi Chemical, and product names "EPICLON 830" and "EPICLON 835", made by DIC), hydrated bisphenol A type epoxy compound (product names "jER YX8000" and "jER YX8034", made by Mitsubishi Chemical, product name "ST-3000", made by Nippon Steel & Sumitomo Metal, product name "Rikaresin HBE-100", made by New Japan Chemical, and product name "Epolite 4000", made by Kyoei Kaguku Kogyou), a long chain bisphenol A type epoxy resin (product names "EXA-4816", "EXA-4850-150", and "EXA-4850-1000", made by DIC), EO-modified bisphenol A type epoxy compound (product names "Adeka Resin EP-4000L" and "Adeka Resin EP-4010L", made by Adeka), phenol novolac type polyfunctional epoxy compound (product name "jER 152", made by Mitsubishi Chemical), a polyfunctional epoxy compound having a naphthalene structure such as 1,6-bis(2,3-epoxy propan-1-yloxy)naphthalene (product name "HP-4032D"), made by DIC), dicyclopentadiene dimethanol diglycidyl ether (product names "Adeka Resin EP-4000L" and "Adeka Resin EP-4088L", made by Adeka), glycidyl amine type epoxy resin (product name "product name "jER630", made by Mitsubishi Chemical, product names "TETRAD-C" and "TETRAD-X", made by Mitsubishi Gas Chemical), chain type alkylpolyfunctional epoxy compound (product name "SR-TMP", made by Sakamoto Yekuhin Kogyo), polyfunctional epoxy polybutadiene (product name "Epolide PB3600", made by Daicel Chemical Industries), a glycidyl polyether compound of glycerin (product name "SR-GLG", made by Sakamoto Yakuhin Kogyo), a diglycerin polyglycidyl ether compound (product name "SR-DGE", made by Sakamoto Yakuhin Kogyo), polyglycerin polyglycidyl ether compound (product name "SR-4GL", made by Sakamoto Yakuhin Kogyo), and γ-glycidoxypropyltrimethylsilane (product name "Z6040", made by Dow Corning Toray) may be mentioned.

In the radiation-sensitive resin composition of the present invention, the content of the epoxy-based cross-linking agent (C) is preferably 5 to 80 parts by weight with respect to 100 parts by weight of the binder resin (A), more preferably 10 to 75 parts by weight, still more preferably 15 to 70 parts by weight. If the epoxy-based cross-linking agent (C) is too great or too small, the effect of addition, that is, the effect of improvement of the adhesion to a metal layer and developability and low hygroscopicity, is liable to be unable to be obtained.

(Aralkyl Phenol Resin (D))

Further, the radiation-sensitive resin composition of the present invention contains an aralkyl phenol resin (D) in addition to the above-mentioned binder resin (A), radiation-sensitive compound (B), and epoxy-based cross-linking agent (C). As explained above, in the present invention, by mixing the aralkyl phenol resin (D) together with the epoxy-based cross-linking agent (C), it is possible to make the obtained resin film high in adhesion to a metal layer and excellent in developability and low hygroscopicity.

The aralkyl phenol resin (D) need be a compound having an aralkyl phenol structure, but in the present invention, a compound represented by the following general formula (5) may be mentioned.

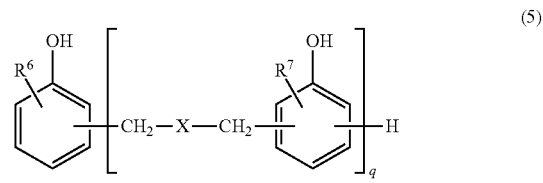

(In the general formula (5), $R^6$ and $R^7$ respectively independently are a hydrogen atom or alkyl group having 1 to 12 carbon atoms, preferably a hydrogen atom or methyl group, "g" is a positive number of 1 to 50, preferably a positive number of 1 to 25. Also, in the formula, X is any group represented by the following general formulas (6) to (8), preferably a group represented by the following general formula (7). Further, the positions of the substituents on the aromatic ring may be any positions. For example, the substituents may be present as any positions of the o-positions, m-positions, and p-positions.)

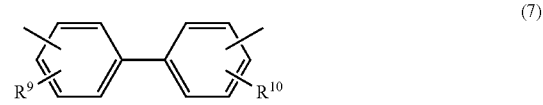

(In the general formulas (6) to (8), $R^8$ to $R^{11}$ respectively independently are a hydrogen atom or alkyl group having 1 to 12 carbon atoms, preferably a hydrogen atom or methyl group. Further, the positions of the substituents on the aromatic ring may be any positions. For example, the substituents may be present as any positions of the o-positions, m-positions, and p-positions.

In the radiation-sensitive resin composition of the present invention, the content of the aralkyl phenol resin (D) is preferably 1 to 100 parts by weight with respect to 100 parts by weight of the binder resin (A), more preferably 2 to 80 parts by weight, still more preferably 3 to 50 parts by weight. If the aralkyl phenol resin (D) is too great or too small, the effect of addition, that is, the effect of improvement of the adhesion to a metal layer, developability, and low hydroscopicity, is liable to be unable to be obtained.

(Methoxymethyl Group-Containing Cross-Linking Agent (E))

Further, the radiation-sensitive resin composition of the present invention may further contain a methoxymethyl group-containing cross-linking agent (E) in addition to the above ingredients. The methoxymethyl group-containing cross-linking agent (E) is used for further improving the low hydroscopicity of the resin film formed using the radiation-sensitive resin composition of the present invention. The methoxymethyl group-containing cross-linking agent (E) is not particularly limited so long as a compound having two or more methoxymethyl groups, but a phenol compound having two or more methoxymethyl groups directly bonded to an aromatic ring or a melamine compound having an amino group substituted by two or more methoxymethyl groups etc. may be mentioned.

As specific examples of such a methoxymethyl group-containing cross-linking agent (E), as a phenol compound having two or more methoxymethyl groups directly bonded to an aromatic ring, for example, a dimethoxymethyl-substituted phenol compound such as 2,6-dimethoxymethyl-4-t-butylphenol and 2,6-dimethoxymethyl-p-cresol, a tetramethoxymethyl-substituted biphenyl compound such as 3,3',5,5'-tetramethoxymethyl-4,4'-dihydroxybiphenyl (for example, product name "IMOM-BP"), made by Honshu Chemical Industry) and 1,1-bis[3,5-di(methoxymethyl)-4-hydroxyphenyl]-1-phenylethane, a hexamethoxymethyl-substituted compound such as 4,4',4"-(ethylidene)trisphenol (for example, product name "HMOM-TPHAP-GB", made by Honshu Chemical Industry), and other hexamethoxymethyl-substituted triphenyl compounds etc. may be mentioned.

As the melamine compound having an amino group substituted by two or more methoxymethyl groups, for example, N,N'-dimethoxymethylmelamine, N,N',N"-trimethoxymethylmelamine, N,N,N',N"-tetramethoxymethylmelamine, N,N,N',N',N"-pentamethoxymethylmelamine, N,N,N',N',N",N"-hexamethoxymethylmelamine (for example, "Nikalac MW-390LM" and "Nikalac MW-100LM", made by Sanwa Chemical), or polymers of these etc. may be mentioned.

These methoxymethyl group-containing cross-linking agents (E) may be used respectively alone or as two types or more combined.

Among these as well, from the viewpoint of the high reactivity, N,N,N',N',N",N"-hexamethoxymethylmelamine is preferable.

In the radiation-sensitive resin composition of the present invention, the content of the methoxymethyl group-containing cross-linking agent (E) is preferably 1 to 100 parts by weight with respect to 100 parts by weight of the binder resin (A), more preferably 2 to 80 parts by weight, still more preferably 5 to 20 parts by weight. By making the content of the methoxymethyl group-containing cross-linking agent (E) the above range, it is possible to further enhance the effect of addition.

(Silane Coupling Agent (F))

Further, the radiation-sensitive resin composition of the present invention may further contain a silane coupling agent (F) in addition to the above ingredients. The silane coupling agent (F) is used for further improving the adhesion to a metal layer of the resin film formed using the radiation-sensitive resin composition of the present invention.

The silane coupling agent (F) is not particularly limited, but, for example, one having a reactive functional group such as an amino group, carboxyl group, methacryloyl group, isocyanate group, and epoxy group etc. may be mentioned.

As specific examples of the silane coupling agent (F), 3-aminopropyltrimethoxysilane, 3-aminopropyltriethoxysilane, N-2-(aminoethyl)-3-aminopropyltrimetoxysilane, N-phenyl-3-aminopropyltrimethoxysilane, trimethoxysilyl benzoic acid, γ-methacryloxypropyltrimethoxysilane, γ-methoacryloxypropyltriethoxysilane, γ-isocyanatepropyltrimethoxysilane, γ-isocyanatepropyltriethoxysilane, γ-glycidoxypropyltrimethoxysilane, γ-glycidoxypropyltriethoxysilane, β-(3,4-epoxy cyclohexyl)ethyltrimethoxysilane, β-(3,4-epoxy cyclohexyl)ethyltrimethoxysilane, etc. may be mentioned. These silane coupling agents (F) can be used respectively alone or as two types or more combined. Among these as well, γ-glycidoxypropyltrimethoxysilane and N-phenyl-3-aminopropyltrimethoxysilane are preferable from the viewpoint of the adhesion with respect to a substrate.

In the radiation-sensitive resin composition of the present invention, the content of the silane coupling agent (F) is preferably 0.01 to 100 parts by weight with respect to 100 parts by weight of the binder resin (A), more preferably 0.1 to 50 parts by weight, still more preferably 0.5 to 20 parts by weight. By making the content of the silane coupling agent (F) the above range, the effect of addition can be raised more.

(Other Compounding Agents)

Further, the radiation-sensitive resin composition of the present invention may further contain an oxetane group-containing compound. As specific examples of an oxetane group-containing compound, 3-ethyl-3{[(3-ethyloxetan-3-yl)methoxy]methyl}oxetan (for example, "OXT-211", made by Toagosei), 1,4-bis{[(3-ethyloxetan-3-yl)methoxy]methyl}benzene (for example, "OXT-121", made by Toagosei), 4,4-bis{[(3-ethyl-3-oxetanyl)methoxy]biphenyl (for example, "ETERNACOLL OXBP", made by Ube Industries) etc. may be mentioned.

Further, the radiation-sensitive resin composition of the present invention may further contain a solvent. The solvent is not particularly limited, but one known as a solvent of a resin composition, for example, acetone, methylethylketone, cyclopentanone, 2-hexanone, 3-hexanone, 2-heptanone, 3-heptanone, 4-heptanone, 2-octanone, 3-octanone, 4-octanone, or other straight chain ketones; n-propyl alcohol, isopropyl alcohol, n-butyl alcohol, cyclohexanol, or other alcohols; ethyleneglycol dimethyl ether, ethyleneglycol diethyl ether, dioxane, or other ethers; ethyleneglycol monomethyl ether, ethyleneglycol monoethyl ether, or other alcohol ethers; propyl formate, butyl formate, propyl acetate, butyl acetate, methyl propionate, ethyl propionate, methyl butyrate, ethyl butyrate, methyl lactate, ethyl lactate, or other esters; cellosolve acetate, methylcellosolve acetate, ethylcellosolve acetate, propylcellosolve acetate, butylcellosolve acetate, or other cellosolve esters; propyleneglycol, propyleneglycol monomethyl ether, propylene glycol monomethyl ether acetate, propylene glycol monoethyl ether acetate, propylene glycol monobutyl ether, or other propylene glycols; diethylene glycol monomethyl ether, diethylene glycol monoethyl ether, diethylene glycol dimethyl ether, diethylene glycol diethyl ether, diethylene glycol methylethyl ether, or other diethylene glycols; γ-butyrolactone, γ-valerolactone, γ-caprolactone, γ-caprylolactone, or other saturated γ-lactones; trichloroethylene or other halogenated hydrocarbons; toluene, xylene, or other aromatic hydrocarbons; dimethylacetoamide, dimethylformamide, N-methylacetoamide, or other polar solvents; etc. may be mentioned. These solvents may be used alone or as two types or more combined. The content of the solvent is preferably 10 to 10000 parts by weight with respect to 100 parts by weight of the binder resin (A), more preferably 50 to 5000 parts by weight, furthermore preferably 100 to 1000 parts by weight in range. Note that, when the resin composition is made to include a solvent, the solvent is normally removed after forming the cured film.

Further, the radiation-sensitive resin composition of the present invention may contain, as desired in a range where the effect of the present invention is not obstructed, another compounding agent such as a compound having an acidic group or thermally latent acidic group, a surfactant, sensitizer, photostabilizer, defoamer, pigment, dye, and filler. Among these, for example a compound having an acidic group or thermally latent acidic group such as described in Japanese Patent Publication No. 2014-29766A may be used. Further, a surfactant, sensitizer, and photostabilizer such as described in Japanese Patent Publication No. 2011-75609A may be used.

The method of preparing the radiation-sensitive resin composition of the present invention is not particularly limited. The components forming the radiation-sensitive resin composition may be mixed by a know method.

The method of mixing is nor particularly limited, but mixing solutions or dispersions obtained by dissolving or dispersing the components forming the radiation-sensitive resin composition in a solvent is preferable. Due to this, the radiation-sensitive resin composition is obtained in the form of a solution or dispersion.

The method of dissolving or dispersing the components forming the radiation-sensitive resin composition may be an ordinary method. Specifically, this may be performed by stirring using a physical stirrer and magnetic stirrer, a high speed homogenizer, disperser, planetary stirrer, twin screw stirrer, ball mill, triple roll, etc. Further, it is possible to dissolve or disperse the components in a solvent, then, for example, filter the result using a filter with a pore size of 0.5 µm or so.

(Electronic Device)

Next, the electronic device of the present invention will be explained. The electronic device of the present invention has a resin film comprised of the above-mentioned radiation-sensitive resin composition of the present invention.

As the electronic device of the present invention, for example, one configured by a board on which a semiconductor device is mounted may be mentioned. Giving one example, an active matrix board, organic EL device board, integrated circuit device board, and solid imaging device board, etc. may be mentioned. The resin film comprised of the radiation-sensitive resin composition of the present invention can be suitably used as an insulating film for redistribution layer use used for a resin film where a high adhesion with respect to the metal layer is demanded, specifically, specifically an insulating film for redistribution layer use used for a redistribution layer (RDL) formed on a surface protective film of a device forming such an electronic device. In particular, the resin film comprised of the radiation-sensitive resin composition of the present invention is excellent in adhesion to a metal layer, so is excellent in adhesion to the copper forming a redistribution layer. Further, the resin film comprised of the radiation-sensitive resin composition of the present invention is excellent in developability, so it is possible to suitably form a resin film corresponding to the patterns of the redistribution layer. Furthermore, the resin film comprised of the radiation-sensitive resin composition of the present invention is excellent in low hygroscopicity, it is possible to further improve the reliability of the obtained electronic device.

In the electronic device of the present invention, the method of forming the resin film is not particularly limited. For example, a method such as the coating method or film lamination method can be used.

The coating method is, for example, the method of coating a radiation-sensitive resin composition, then drying by heating to remove the solvent. As the method of coating the radiation-sensitive resin composition, for example, various methods such as spray method, spin coat method, roll coat method, die coat method, doctor blade method, spin coat method, bar coat method, screen print method, and inkjet method can be employed. The heating and drying conditions differ according to the type and ratio of the ingredients, but are usually 30 to 150° C., preferably 60 to 120° C. usually for 0.5 to 90 minutes, preferably 1 to 60 minutes, more preferably 1 to 30 minutes.

The film lamination method is a method comprising coating a radiation-sensitive resin composition on a resin film, metal film or other substrate for forming B-stage film, then heating and drying it to remove the solvent to obtain the B-stage film, the laminating this B-stage film. The heating and drying conditions may be suitably selected in accordance with the types and ratios of content of the ingredients, but the heating temperature is usually 30 to 150° C. and the heating time is usually 0.5 to 90 minutes. The film lamination may be performed by using a press laminator, press, vacuum laminator, vacuum press, roll laminator, and other press bonding machines.

The thickness of the resin film is not particularly limited, but is preferably 0.1 to 100 µm, more preferably 0.5 to 50 µm, still more preferably 0.5 to 30 µm.

Next, the thus formed resin film is patterned by desired patterns. As the method of patterning the resin film, for example, the method of using the radiation-sensitive resin composition of the present invention to form a resin film before patterning, irradiating activating radiation on the resin film before patterning to form latent image patterns, then bringing the resin film having the latent image patterns into contact with a developer to manifest the patterns, etc. may be mentioned.

The active radiation is not particularly limited so long as able to activate the radiation-sensitive compound (B) contained in the radiation-sensitive resin composition and change the alkali solubility of the radiation-sensitive resin composition containing the radiation-sensitive compound (B). Specifically, ultraviolet light, g-rays or i-rays and other single wavelength ultraviolet light, KrF excimer laser light, ArF excimer laser light, and other light beams; electron beams and other particle beams; etc. may be used. As the method of selectively radiating active radiation in a pattern manner to form latent patterns, an ordinary method may be used. For example, the method of using a reduced projection exposure apparatus etc. to irradiate ultraviolet light, g-rays, i-rays, KrF excimer laser light, ArF excimer laser light, and other light beams through a desired mask pattern or the method of using an electron beam or other particle beam for lithography etc. may be used. When using light beams as active radiation, single wavelength light or mixed wavelength light may be used. The irradiation conditions may be suitably selected in accordance with the active radiation used, but, for example, when using wavelength 200 to 450 nm light beams, the amount of irradiation is normally 10 to 5,000 $mJ/cm^2$, preferably 50 to 1,500 $mJ/cm^2$ in range and is determined in accordance with the irradiation time and illuminance. After irradiating the active radiation in this way, in accordance with need, the resin film is heat treated at 60 to 130° C. or so in temperature for 1 to 2 minutes or so.

Next, the latent patterns which are formed in the resin film before patterning are developed to bring them out. As the developing solution, normally aqueous solutions of alkali compounds may be used. As alkali compounds, for example alkali metal salts, amines, and ammonium salts may be used. The alkaline compounds may be inorganic compounds or organic compounds. As specific examples of these compounds, sodium hydroxide, potassium hydroxide, sodium carbonate, sodium silicate, metasodium silicate, and other alkali metal salts; ammonia water; ethylamine, n-propylamine, and other primary amines; diethylamine, di-n-propylamine, and other secondary amines; triethylamine, methyldiethylamine, and other tertiary amines; tetramethylammonium hydroxide, tetraethylammonium hydroxide, tetrabutylammonium hydroxide, choline, and other quaternary ammonium salts; dimethylethanolamine, triethanolamine, and other alcohol amines; pyrrol, piperidine, 1,8-diazabicyclo[5.4.0]undec-7-ene, 1,5-diazabicyclo[4.3.0]non-5-ene, N-methylpyrrolidone, and other cyclic amines; etc. may be mentioned. These alkali compounds may be respectively used alone or as two types or more combined.

As the aqueous medium of the alkali aqueous solution, water; methanol, ethanol, and other water soluble organic solvents may be used. The alkali aqueous solution may have a surfactant etc. added in a suitable amount.

As the method for bringing the developing solution in contact with the resin film which has the latent patterns, for example, the puddle method, spray method, dipping method, and other methods may be used. The development conditions are suitably selected as normally 0 to 100° C., preferably 5 to 55° C., more preferably 10 to 30° C. and normally 30 to 180 seconds.

The resin film formed with the targeted patterns in this way may, in accordance with need, be rinsed by a rinse solution to remove the developer residue. After rinsing, the remaining rinse solution is removed by compressed air or compressed nitrogen.

Furthermore, in accordance with need, to deactivate the radiation-sensitive compound (B) contained in the radiation-sensitive resin composition, it is possible to irradiate the entire surface of the electronic device with activating radiation. The activating radiation can be irradiated utilizing the method illustrated for formation of the above latent patterns. The resin film may be heated at the same time as irradiation or after irradiation. As the heating method, for example, the method of heating the electronic device by a hot plate or in an oven may be mentioned. The temperature is usually 80 to 300° C., preferably 100 to 200° C. in range.

Next, the thus formed resin film is patterned, the cross-linked. Such cross-linking is usually performed by heating, but the method may be suitably selected in accordance with the type of the epoxy-based cross-linking agent (C) contained in the radiation-sensitive resin composition or the methoxymethyl group-containing cross-linking agent (E) used in accordance with need. The heating method may be one using, for example, a hot plate, oven, etc. The heating temperature is usually 180 to 250° C., while the heating time is suitably selected according to the area or thickness of the resin film or the equipment used etc. For example, when using a hot plate, the time is usually 5 to 60 minutes, while when using an oven, the time is usually 30 to 90 minutes in range. The heating may be performed, in accordance with need, in an inert gas atmosphere. As the inert gas, one not containing oxygen and not causing oxidation of the resin film, for example, nitrogen, argon, helium, neon, xenon, krypton, etc., may be mentioned. Among these as well, nitrogen and argon are preferable, in particular nitrogen is preferable. In particular, an inert gas having an oxygen content of 0.1 vol % or less, preferably 0.01 vol % or less, particularly nitrogen gas, is preferable. These inert gases may be used respectively alone or as two types or more in combination.

An electronic device including a patterned resin film can be produced in this way.

EXAMPLES

Below, examples and comparative examples will be given to explain the present invention more specifically. In the examples, "parts" are based on weight unless otherwise indicated.

Note that, the definitions of the different characteristics and methods of evaluation were as follows.

<Adhesion to Copper>

Using a spattering device, a silicon wafer formed with a 50 nm thick titanium film on which copper is formed to a 100 nm thickness was spin coated with a radiation-sensitive resin composition prepared in each of the examples and comparative examples, then a hot plate was used to prebake the resin at 120° C. for 2 minutes to thereby form a resin film. Next, this was heated in nitrogen at 230° C. for 1 hour to obtain a resin film-coated silicon wafer formed with a 3 μm thick resin film. Further, the obtained silicon resin film-coated wafer was used to evaluate the adhesion of the formed resin film with respect to copper by the following explained surface and an interfacial cutting analysis system (SAICAS) method.

Specifically, the resin film part of the above obtained resin film-coated wafer was given 1 mm width cuts by a cutter. The wafer with the cut resin film was measured for adhesion by a Daipla Wintes SAICAS Model DN-20 as adhesion measurement apparatus. A cutter blade of monocrystalline diamond (1.0 mm width, rake angle 20°, relief angle 10°) was used to cut a sample at a horizontal speed of 0.2 μm/sec and vertical speed of 0.02 μm/sec. When the cutter blade cut to the interface between the resin film and soda glass surface, the cutter blade was moved parallel to the wafer at a vertical speed of 0 μm/sec to measure the parallel force FH (N). Further, the peel strength P was found from the obtained parallel force FH (N) and width "w" (M) of the cutter blade by the calculation formula "P(N/m)=FH(N)/w(m)", and the obtained peel strength P was evaluated as the value of the adhesion of the resin film to copper by the following criteria. The larger the value of the peel strength P, the better the adhesion of the resin film to copper that can be evaluated.

A: Peel strength P of 100 N/m or more
B: Peel strength P of 70 N/m to less than 100 N/m
C: Peel strength P of less than 70 N/m <Developability>

On a silicon wafer, a radiation-sensitive resin composition prepared in each of the examples and comparative examples was spin coated and prebaked using a hot plate at 120° C. for 2 minutes to form a thickness 3 μm resin film. Next, a high pressure mercury lamp emitting light of the wavelength of g-rays (436 nm), b-rays (405 nm), and i-rays (365 nm) was used to expose this at 400 mJ/cm². Further, the exposed sample was dipped in a 23° C. 2.38% tetramethylammonium hydroxide aqueous solution (alkali developer) for 3 minutes, then was rinsed by ultrapure water for 30 seconds, then the surface conditions of the developed sample were visually examined. The following criteria were used to evaluate the developability. Samples with no dissolution or swelling of the resin film can be judged as excellent in developability as a positive-type resin film.
A: Resin film completely dissolved.
C: Resin film did not dissolve at all or swelled.

<Amount of Water Absorption>

On a silicon wafer, a radiation-sensitive resin composition prepared in each of the examples and comparative examples was spin coated and prebaked using a hot plate at 120° C. for 2 minutes to form a resin film. Next, this was heated in nitrogen at 230° C. for 1 hour to thereby obtain a resin film-coated silicon wafer formed with a thickness 3 μm resin film. Further, the obtained silicon wafer with resin film was placed in a highly accelerated stress test apparatus (HAST apparatus) and allowed to stand at 130° C. in a 98% RH environment for 200 hours.

Further, a silicon wafer with the resin film before the highly accelerated lifetime test and after the highly accelerated lifetime test was used to measure the amount of water absorption. Specifically, each silicon wafer with resin film was raised by 60° C./min to 300° C. using a thermal desorption spectrometer (TDS, made by ESCO, Model No. "WA1000S/W") and held there for 30 minutes to measure the amount of water absorption per unit volume of the resin film. Further, based on the obtained measurement results, the amount of water absorption of the resin film was calculated in accordance with the below formula. The smaller the amount of water absorption, the higher the insulating ability that can be maintained even under a high temperature and high moisture and therefore the more improved the reliability that can be judged.

Amount of water absorption=Amount of moisture of resin film after highly accelerated lifetime test-amount of moisture of resin film before highly accelerated lifetime test.

Note that the amount of water absorption (low hygroscopicity) was evaluated by the following criteria.
A: Amount of water absorption of less than 1500 weight ppm
B: Amount of water absorption of 1500 weight ppm to less than 3000 weight ppm
C: Amount of water absorption of 3000 weight ppm or more Synthesis Example 1

<Preparation of Cyclic Olefin Polymer (A-1)>
100 parts of a monomer mixture including 40 mol % of N-phenyl-bicyclo[2.2.1]hept-5-ene-2,3-dicarboxyimide (NBPI) and 60 mol % of 4-hydroxycarbonyltetracyclo [6.2.1.1$^{3,6}$.0$^{2,7}$]dodec-9-ene (TODC), 2.0 parts of 1,5-hexadiene, 0.02 part of (1,3-dimesitylimidazolin-2-ylidene) (tricyclohexylphosphine)benzylideneruthenium dichloride (synthesized by method described in Org. Lett., vol. 1, page 953, 1999), and 200 parts of diethylene glycol ethyl methyl ether were charged into a nitrogen-substituted glass pressure resistant reactor. The mixture was stirred while causing a reaction at 80° C. for 4 hours to obtain a polymerization reaction solution.

Further, the obtained polymerization reaction solution was placed in an autoclave and stirred at 150° C. under a hydrogen pressure of 4 MPa for 5 hours to cause a hydrogenation reaction and obtain a polymer solution containing a cyclic olefin polymer (A-1). The polymerization conversion rate of the obtained cyclic olefin polymer (A-1) was 99.7%, the weight average molecule weight converted to polystyrene was 7,150, the number average molecular weight was 4,690, the molecular weight distribution as 1.52, and the hydrogenation rate was 99.7%. Further, the solid content concentration of the polymer solution of the obtained cyclic olefin polymer (A-1) was 34.4 wt %.

Example 1

A binder resin (A) comprised of 291 parts of a polymer solution of the cyclic olefin polymer (A-1) obtained in Synthesis Example 1 (100 parts by weight as cyclic olefin polymer (A-1)), a radiation-sensitive compound (B) comprised of 35 parts of a condensate of 4,4'-[1-[4-[1-[4-hydroxyphenyl]-1-methylethyl]phenyl]ethylidene]bisphenol (1 mole) and 1,2-napthoquinone diazide-5-sulfonic acid chloride (2.5 moles), an epoxy-based cross-linking agent (C) comprised of 30 parts of epoxylated butanetetracarboxylic acid tetrakis(3-cyclohexenylmethyl)-modified ε-caprolactone (product name "Epolide GT401", made by Daicel Chemical Industries, aliphatic cyclic tetrafunctional epoxy resin, epoxy equivalent: 220, liquid at ordinary temperature), an aralkyl phenol resin (D) comprised of 20 parts of an aralkyl phenol resin (product name "GPH-65", made by Nippon Kayaku, where, in general formula (5), X is a compound represented by the above formula (7)), a silane coupling agent (F) comprised of 1 part of γ-glycidoxypropyltrimethoxysilane (product name "Z6040", made by Dow Corning Toray), and a solvent comprised of 160 parts of diethylene glycol ethyl methyl ether were mixed and dissolved, then were filtered by a polytetraflurorethylene filter of a pore size 0.45 μm to prepare a radiation-sensitive resin composition.

Further, the above obtained radiation-sensitive resin composition was used to measure and evaluate the adhesion to copper, the developability, and the amount of water absorption. The results are shown in Table 1.

Example 2

Except for changing the amount of epoxylated butanetetracarboxylic acid tetrakis(3-cyclohexenylmethyl)-modified ε-caprolactone from 30 parts to 15 parts and the amount of aralykl phenol resin from 20 parts to 30 parts and further including a methoxymethyl group-containing cross-linking agent (E) comprised of 15 parts of hexamethoxymethylmelamine (product name "Nikalac MW-100LM", made by Sanwa Chemical) in Example 1, the same procedure was followed as in Example 1 to prepare a radiation-sensitive resin composition and the same procedure was followed to measure and evaluate it. The results are shown in Table 1.

Example 3

Except for changing the amount of the epoxylated butanetetracarboxylic acid tetrakis(3-cyclohexenylmethyl)-modified ε-caprolactone from 15 parts to 30 parts and the amount of γ-glycidoxypropyltrimethoxysilane from 1 part to 2 parts in Example 2, the same procedure was followed as in Example 2 to prepare a radiation-sensitive resin composition and the same procedure was followed to measure and evaluate it. The results are shown in Table 1.

Example 4

Except for changing the amount of the epoxylated butanetetracarboxylic acid tetrakis(3-cyclohexenylmethyl)-modified ε-caprolactone from 15 parts to 20 parts, the amount of aralkyl phenol resin from 30 parts to 50 parts, the amount of hexamethoxymethylmelamine from 15 parts to 25 parts, and the amount of γ-glycidoxypropyltrimethoxysilane from 1 part to 5 parts in Example 2, the same procedure was followed as in Example 2 to prepare a radiation-sensitive resin composition and the same procedure was followed to measure and evaluate it. The results are shown in Table 1.

Example 5

Except for using an epoxy-based cross-linking agent (C) comprised of 30 parts of 1,6-bis propan-1-yloxy)naphthalene (product name "HP-4032D", made by DIC, bifunctional epoxy compound, epoxy equivalent: 140, liquid at ordinary temperature) instead of 15 parts of epoxylated butanetetracarboxylic acid tetrakis(3-cyclohexenylmethyl)-modified ε-caprolactone in Example 2, the same procedure was followed as in Example 2 to prepare a radiation-sensitive resin composition and the same procedure was followed to measure and evaluate it. The results are shown in Table 1.

Example 6

Except for using an epoxy-based cross-linking agent (C) comprised of 30 part of a bisphenol F type epoxy compound (product name "jER YL983U", made by Mitsubishi Chemical, bifunctional epoxy compound, epoxy equivalent; 170, liquid at ordinary temperature) instead of 15 parts of epoxylated butanetetracarboxylic acid tetrakis(3-cyclohexenylmethyl)-modified ε-caprolactone and changing the amount of γ-glycidoxypropyltrimetoxysilane from 1 part to 2 parts in Example 2, the same procedure was followed as in Example 2 to prepare a radiation-sensitive resin composition and the same procedure was followed to measure and evaluate it. The results are shown in Table 1.

Example 7

Except for using a methoxymethyl group-containing cross-linking agent (E) comprised of 15 parts of a hexamethoxymethyl-substituted compound of 4,4',4'-(ethylidene)trisphenol) (product name "HMOM-TPHAP-GB", made by Honshu Chemical Industry) instead of 15 parts of hexamethoxymethylmelamine and using a silane coupling agent (F) comprised of 2 parts or N-phenyl-3-aminopropyltrimethoxysilane (product name "KEM-573", Shin-Etsu Chemical) instead of 1 part of γ-glycidoxypropyltrimethoxysilane in Example 5, the same procedure was followed as in Example 5 to prepare a radiation-sensitive resin composition and the same procedure was followed to measure and evaluate it. The results are shown in Table 1.

Example 8

Except for using a methoxymethyl group-containing cross-linking agent (E) comprised of 15 parts of 3,3',5,5'-tetramethoxymethyl-4,4'-dihydroxybiphenyl (product name "TMOM-BP", made by Honshu Chemical Industry) instead of 15 parts of hexamethoxymethylmelamine and using a silane coupling agent (F) comprised of 2 parts of N-phenyl-3-aminopropyltrimethoxysilane (product name "KEM-573", Shin-Etsu Chemical) instead of 2 parts of γ-glycidoxypropyltrimethoxysilane in Example 6, the same procedure was followed as in Example 6 to prepare a radiation-sensitive resin composition, and the same procedure was followed to measure and evaluate it. The results are shown in Table 1.

Example 9

Except for using an epoxy-based cross-linking agent (C) comprised of 15 parts of 1,6-bis(2,3-epoxy propan-1-yloxy) naphthalene and 20 parts of a long chain bisphenol A type epoxy resin (product name "EXA-4016", made by DIC, bifunctional epoxy compound, epoxy equivalent: 403, liquid at ordinary temperature) instead of 30 parts of 1,6-bis(2,3-epoxy propan-1-yloxy)naphthalene, using a methoxymethyl group-containing cross-linking agent (E) comprised of 30 parts of an oxetane group-containing cross-linking agent (product name "ETERNACOLL OXBP", made by Ube Industries) instead of 15 parts of hexamethoxymethylmelamine, and changing the amount of γ-glycidoxypropyltrimethoxysilane from 1 part to 2 parts in Example 5, the same procedure was followed as in Example 5 to prepare a radiation-sensitive resin composition and the same procedure was followed to measure and evaluate it. The results are shown in Table 1.

Example 10

Except for not adding 1,6-bis(2,3-epoxy propan-1-yloxy) naphthalene and γ-glycidoxypropyltrimethoxysilane and changing the amount of the oxetane group-containing cross-linking agent from 30 parts to 50 parts in Example 9, the same procedure was followed as in Example 3 to prepare a radiation-sensitive resin composition and the same procedure was followed to measure and evaluate it. The results are shown in Table 1.

Example 11

Except for not adding γ-glycidoxypropyltrimethoxysilane in Example 4, the same procedure was followed as in Example 4 to prepare a radiation-sensitive resin composition and the same procedure was followed to measure and evaluate it. The results are shown in Table 1.

Comparative Example 1

Except for not adding epoxylated butanetetracarboxylic acid tetrakis(3-cyclohexenylmethyl)-modified ε-caprolactone and aralkyl phenol resin in Example 3, the same procedure was followed as in Example 3 to prepare a radiation-sensitive resin composition and the same procedure was followed to measure and evaluate it. The results are shown in Table 1.

Comparative Example 2

Except for not adding aralkyl phenol resin and hexamethoxymethylmelamine in Example 3, the same procedure was followed as in Example 3 to prepare a radiation-sensitive resin composition and the same procedure was followed to measure and evaluate it. The results are shown in Table 1.

Comparative Example 3

Except for using 30 parts of a long chain bisphenol A type epoxy resin (product name "EXA-4816", made by DIC, bifunctional epoxy compound, epoxy equivalent: 403, liquid at ordinary temperature) instead of 30 parts of 1,6-bis(2,3-epoxy propan-1-yloxy)naphthalene and not adding an aralkyl phenol resin in Example 3, the same procedure was followed as in Example 3 to prepare a radiation-sensitive resin composition and the same procedure was followed to measure and evaluate it. The results are shown in Table 1.

Comparative Example 4

Except for not adding an aralkyl phenol resin and changing the amount of γ-glycidoxypropyltrimethoxysilane from 1 part to 2 parts and further adding 30 parts of a glycidyl ether type epoxy compound (product name "Epiclon HP7200HH", made by DIC, polyfunctional epoxy compound, epoxy equivalent: 280, softening point: 92° C.) in Example 2, the same procedure was followed as in Example 2 to prepare a radiation-sensitive resin composition and the same procedure was followed to measure and evaluate it. The results are shown in Table 1.

As shown in Table 1, a resin film obtained using a radiation-sensitive resin composition containing a binder resin (A), a radiation-sensitive compound (B), a tetrafunctional or lower functional epoxy-based cross-linking agent (C) having an epoxy equivalent of 450 or less and a softening point of 30° C. or less, and an aralkyl phenol resin (D) is high in adhesion to a metal layer (copper) and excellent in developability and low water absorption (Examples 1 to 11). From these results, the resin film obtained using the radiation-sensitive resin composition of the present invention can be said to be particularly suitable for applications where a high adhesion with respect to the metal layer is demanded, specifically applications as resin films for redistribution layers formed on surface protective films of devices forming electronic devices.

On the other hand, if not adding an aralkyl phenol resin, the result is that in each case, the obtained resin film becomes inferior in adhesion to a metal layer (copper) (Comparative Examples 1 to 4).

Further, when using one with a softening point exceeding 30° C. as an epoxy-based cross-linking agent (C), the result is that the obtained resin film becomes inferior in adhesion with respect to a metal layer (copper) and developability (Comparative Example 4).

TABLE 1

| | | Examples | | | | | | | | | | | Comparative Examples | | | |
|---|---|---|---|---|---|---|---|---|---|---|---|---|---|---|---|---|
| | | 1 | 2 | 3 | 4 | 5 | 6 | 7 | 8 | 9 | 10 | 11 | 1 | 2 | 3 | 4 |
| Composition of resin composition | | | | | | | | | | | | | | | | |
| Cyclic olefin polymer (A-1) | (parts) | 100 | 100 | 100 | 100 | 100 | 100 | 100 | 100 | 100 | 100 | 100 | 100 | 100 | 100 | 100 |
| Radiation-sensitive compound (TPA520) | (parts) | 35 | 35 | 35 | 35 | 35 | 35 | 35 | 35 | 35 | 35 | 35 | 35 | 35 | 35 | 35 |
| Tetrafunctional epoxy-based cross-linking agent (GT401) (epoxy equivalent: 220, liquid at ordinary temperature) | (parts) | 30 | 15 | 30 | 20 | | | | | | 20 | | | 30 | | 15 |
| Bifunctional epoxy-based cross-linking agent (HP-4032D) (epoxy equivalent: 140, liquid at ordinary temperature) | (parts) | | | | | 30 | | 30 | | 15 | | | | | | |
| Bifunctional epoxy-based cross-linking agent (jER YL983U) (epoxy equivalent: 170, liquid at ordinary temperature) | (parts) | | | | | | 30 | | 30 | | | | | | | |
| Bifunctional epoxy-based cross-linking agent (EXA-4816) (epoxy equivalent: 403, liquid at ordinary temperature) | (parts) | | | | | | | | | | 20 | 20 | | | 30 | |
| Polyfunctional epoxy-based cross-linking agent (HP7200HH) (epoxy equivalent: 280, softening point: 92° C.) | (parts) | | | | | | | | | | | | | | | 30 |
| Aralkyl phenol resin (GPH-65) | (parts) | 20 | 30 | 30 | 50 | 30 | 30 | 30 | 30 | 30 | 30 | 50 | | | | |
| Methoxymethyl group-containing cross-linking agent (MW-100LM) | (parts) | | 15 | 15 | 25 | 15 | 15 | | | | | 25 | 15 | | 15 | 15 |
| Methoxymethyl group-containing cross-linking agent (HMOM-TPHAP-GB) | (parts) | | | | | | | 15 | | | | | | | | |
| Methoxymethyl group-containing cross-linking agent (TMOM-BP) | (parts) | | | | | | | | 15 | | | | | | | |
| Oxetane group-containing cross-linking agent (OXBP) | (parts) | | | | | | | | | 30 | 50 | | | | | |
| γ-glycidoxypropyltrimethoxysilane | (parts) | 1 | 1 | 2 | 5 | 1 | 2 | | | 2 | | | 2 | 2 | 2 | 2 |
| N-phenyl-3-aminopropyltrimethoxysilane | (parts) | | | | | | | 2 | 2 | | | | | | | |
| Evaluation | | | | | | | | | | | | | | | | |
| Adhesion to copper | | A | A | A | A | A | A | A | A | A | B | B | C | C | C | C |
| Developability | | A | A | A | A | A | A | A | A | A | A | A | A | A | A | C |
| Amount of water absorption | | B | A | A | A | A | A | A | A | B | A | A | B | C | B | B |

The invention claimed is:

1. A radiation-sensitive resin composition comprising a binder resin (A), a quinone diazide compound (B), an epoxy cross-linking agent (C) having two to four functional groups, an epoxy equivalent of 450 or less and a softening point of 30° C. or less, and an aralkyl phenol resin (D),
wherein the aralkyl phenol resin (D) is a compound represented by the following general formula (5):

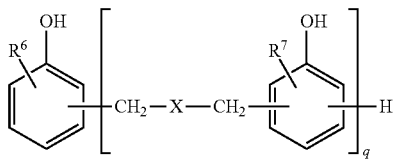
(5)

wherein, in the general formula (5), $R^6$ and $R^7$ respectively independently are a hydrogen atom or alkyl group having 1 to 12 carbon atoms and "q" is a positive number of 1 to 50,
wherein X is any group represented by the following general formulas (7) to (8):

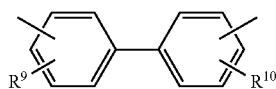
(7)

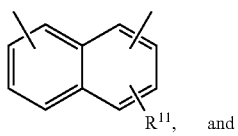
(8)

and wherein, in the general formulas (7) to (8), $R^9$ to $R^{11}$ respectively independently are a hydrogen atom or alkyl group having 1 to 12 carbon atoms.

2. The radiation-sensitive resin composition according to claim 1 wherein the binder resin (A) is a cyclic olefin polymer having a protonic polar group.

3. The radiation-sensitive resin composition according to claim 1 wherein a content of the epoxy cross-linking agent (C) is 5 to 80 parts by weight with respect to 100 parts by weight of the binder resin (A).

4. The radiation-sensitive resin composition according to claim 1 wherein a content of the aralkyl phenol resin (D) is 1 to 100 parts by weight with respect to 100 parts by weight of the binder resin (A).

5. The radiation-sensitive resin composition according to claim 1 further comprising a methoxymethyl group-containing cross-linking agent (E).

6. The radiation-sensitive resin composition according to claim 1 further comprising a silane coupling agent (F).

7. The radiation-sensitive resin composition according to claim 1, wherein a content of the silane coupling agent (F) is 0.01 to 100 parts by weight with respect to 100 parts by weight of the binder resin (A).

8. An electronic device containing a resin film comprising a radiation-sensitive resin composition according to claim 1.

* * * * *